(12) United States Patent
Goshi et al.

(10) Patent No.: US 9,662,685 B2
(45) Date of Patent: May 30, 2017

(54) SUBSTRATE PROCESSING APPARATUS, SUBSTRATE PROCESSING METHOD, FLUID SUPPLYING METHOD AND STORAGE MEDIUM

(71) Applicant: Tokyo Electron Limited, Tokyo (JP)

(72) Inventors: Gentaro Goshi, Kumamoto (JP); Kazuyuki Mitsuoka, Yamanashi (JP); Gen You, Yamanashi (JP); Hiroki Ohno, Yamanashi (JP); Takehiko Orii, Yamanashi (JP); Takayuki Toshima, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 955 days.

(21) Appl. No.: 13/910,270

(22) Filed: Jun. 5, 2013

(65) Prior Publication Data

US 2013/0333726 A1     Dec. 19, 2013

(30) Foreign Application Priority Data

Jun. 8, 2012 (JP) ................................ 2012-131031
Jul. 17, 2012 (JP) ................................ 2012-158932

(51) Int. Cl.
   *B08B 3/00* (2006.01)
   *B08B 3/10* (2006.01)
   *H01L 21/67* (2006.01)

(52) U.S. Cl.
   CPC .......... *B08B 3/10* (2013.01); *H01L 21/67034* (2013.01); *H01L 21/67051* (2013.01); *H01L 21/67109* (2013.01)

(58) Field of Classification Search
   CPC ................. B08B 3/10; H01L 21/67034; H01L 21/67051; H01L 21/67109
   See application file for complete search history.

(56) References Cited

U.S. PATENT DOCUMENTS

2012/0048304 A1*  3/2012  Kitajima ........... H01L 21/67034
                                                                134/30

FOREIGN PATENT DOCUMENTS

| JP | 2006-108402 A | 4/2006 |
| JP | 2006-294662 A | 10/2006 |
| JP | 2006-326429 A | 12/2006 |
| JP | 2007-175559 A | 7/2007 |
| JP | 2008-066495 A | 3/2008 |

* cited by examiner

*Primary Examiner* — David Cormier
(74) *Attorney, Agent, or Firm* — Abelman, Frayne & Schwab

(57) ABSTRACT

The present disclosure provides a substrate processing apparatus including: a processing chamber configured to process a substrate; a fluid supply source configured to supply a substrate processing fluid used in processing for the substrate in a predetermined pressure; a constant pressure supplying path configured to supply the substrate processing fluid from the fluid supply source to the processing chamber in a predetermined pressure without boosting the pressure of the substrate processing liquid; a boosted pressure supplying path configured to boost the pressure of the substrate processing fluid from the fluid supply source into a predetermined pressure by a booster mechanism and supply the pressure boosted substrate processing fluid to the processing chamber; and a control unit configured to switch over the constant pressure supplying path and the boosted pressure supplying path.

5 Claims, 14 Drawing Sheets

SUBSTRATE PROCESSING APPARATUS, SUBSTRATE PROCESSING METHOD, FLUID SUPPLYING METHOD AND STORAGE MEDIUM

CROSS-REFERENCE TO RELATED APPLICATIONS

This application is based on and claims priority from Japanese Patent Application Nos. 2012-131031 and 2012-158932, filed on Jun. 8, 2012 and Jul. 17, 2012, respectively, with the Japan Patent Office, the disclosures of which are incorporated herein in their entireties by reference.

TECHNICAL FIELD

The present disclosure relates to a substrate processing apparatus and a substrate processing method, and particularly, to a substrate processing apparatus and a substrate processing method in which a substrate is subjected to a dry processing in a supercritical state or a subcritical state.

Further, the present disclosure relates to a technology in which a high-pressure fluid (supercritical fluid or subcritical fluid) or the raw materials thereof is supplied to a processing chamber where a processing of removing the liquid attached to a substrate is performed by the high-pressure fluid.

BACKGROUND

In the related art, when semiconductor components or flat panel displays are manufactured, a substrate processing apparatus is used to perform a liquid processing such as, for example, a cleaning process or an etching process for a substrate such as, for example, a semiconductor wafer and a liquid crystal substrate, with various kinds of processing liquids, and then, to perform a dry processing that removes the processing liquids remaining on the substrate.

In the substrate processing apparatus, a phenomenon called a substrate surface pattern collapse occurs in which the pattern of the substrate surface collapses by the action of the surface tension of the processing liquid remaining on the substrate during the dry processing. The pattern collapse occurs as the aspect ratio becomes higher according to the miniaturization of the pattern a substrate surface such as, for example, an etching mask pattern and a circuit pattern formed on the substrate surface.

In the conventional substrate processing apparatus, a substrate is processed with a processing liquid using a substrate liquid processing device, and thereafter, the substrate is subjected to a dry processing using a substrate dry processing device by substituting the processing liquid attached to the surface of the substrate with a substrate processing fluid in a supercritical state (carbon dioxide etc.) and then removing the supercritical fluid from the surface of the substrate.

In the substrate processing apparatus in which the dry processing is performed in the supercritical state, a fluid supply source that supplies the substrate processing fluid in a gas state and a processing chamber that processes the substrate are connected with each other by a supplying path, and a booster mechanism (pump) is installed in the middle portion of the supplying path to boost and deliver the substrate processing fluid into a predetermined pressure.

In the substrate processing apparatus, the substrate processing fluid supplied from the fluid supply source is boosted to a pressure to become a supercritical state by the booster mechanism, and then is supplied to the processing chamber, thereby performing the dry processing for the substrate using the substrate processing fluid in the supercritical state.

However, in the conventional substrate processing apparatus, since the substrate processing fluid is supplied to the processing chamber after the booster mechanism installed on the supplying path boosts the fluid, there is a concern that particles such as a dust which is generated by the booster mechanism when the substrate processing fluid passes the booster mechanism may be mixed into the substrate processing fluid.

Specifically, in the conventional substrate processing apparatus, since the substrate processing fluid always passes the booster mechanism when the substrate processing fluid is supplied to the processing chamber, there is a concern that the frequency where the particles are mixed into the substrate processing fluid may be increased and the substrate surface may be contaminated by the mixed particles. See, for example, Japanese Patent Laid-Open Publication No. 2008-66495.

Meanwhile, the process of manufacturing a semiconductor device in which a stack structure of an integrated circuit is formed on the surface of a substrate, such as a semiconductor wafer (hereinafter, a wafer) includes a liquid processing that processes the wafer surface using a cleaning liquid such as, for example, a chemical solution to remove minute dusts or native oxide layers on the wafer surface.

As the semiconductor devices are becoming highly integrated, there is a concern that a phenomenon called a pattern collapse occurs when the liquid attached to the wafer surface is removed in the liquid processing process. The pattern collapse is a phenomenon in which the balance of the surface tension horizontally pulling the convex portion is lost, and, as a result, the convex portions fall down toward the side where more liquids remain at the time of drying the remaining liquids on the wafer surface, as the liquids remaining at the left and right sides of the convex portion of concave and convex portions forming a pattern are unevenly dried.

As for a technique which removes the remaining liquids on the wafer surface while preventing the pattern collapse from being occurred, a method is known for using a fluid in a supercritical state or a subcritical state (hereinafter, collectively referred to as a high-pressure state). The viscosity of the fluid in the high-pressure state (high-pressure fluid) is lower than a liquid while the ability to dissolve the fluid is higher than the liquid. Further, there is no interface between the high-pressure fluid and a liquid or a gas which is in equilibrium state. Therefore, the liquid attached to the wafer surface is substituted with the high-pressure fluid, and thereafter, when the high-pressure fluid is changed to a gas state, the liquid may be dried without being affected by the surface tension.

For example, Japanese Patent Laid-Open Publication No. 2006-294662 (see, e.g., paragraphs [0028], [0036]-[0040], and FIG. 1) discloses a technology in which a liquid carbon dioxide is introduced into a high pressure chamber accommodating a substrate. The introduced liquid carbon dioxide is made to a supercritical state by being heated within the high-pressure chamber, and substitutes the liquid attached to the surface of the substrate. Here, in a supplying path through which the liquid carbon dioxide supplied to the high-pressure chamber flows, a filter is installed to prevent the liquid carbon dioxide from carrying the particles (foreign matters) from a vessel in which the liquid carbon dioxide is stored.

However, since the substrate is carried into the high-pressure chamber under the atmospheric pressure and then the supply of the liquid carbon dioxide is initiated, the pressure within the supplying path having the filter is greatly changed from the atmospheric pressure to a pressure where the carbon dioxide at the room temperature may be maintained to a liquid state (7.5 MPa in the case of Japanese Patent Laid-Open Publication No. 2006-294662). Further, the carbon dioxide passes the filter in a gas state during a period where the pressure within the supplying path is low and may become a liquid state as the pressure within the supplying path is increased. Therefore, the viscosity or density of the fluid that passes the filter may be greatly changed. As a result, there is a concern that the particles collected when the fluid passes the filter in a gas state are discharged as the fluid that passes the filter is changed to a liquid state, and introduced to the high-pressure chamber to contaminate the substrate.

SUMMARY

According to an aspect of the present disclosure, provided is a substrate processing apparatus including: a processing chamber configured to process a substrate; a fluid supply source configured to supply a substrate processing fluid used in processing for the substrate in a predetermined pressure; a constant pressure supplying path configured to supply the substrate processing fluid from the fluid supply source to the processing chamber in a predetermined pressure without boosting the pressure of the substrate processing liquid; a boosted pressure supplying path configured to boost the pressure of the substrate processing fluid from the fluid supply source into a predetermined pressure by a booster mechanism and supply the pressure boosted substrate processing fluid to the processing chamber; and a control unit configured to switch over the constant pressure supplying path and the boosted pressure supplying path. The control unit may control the substrate processing apparatus such that the substrate processing fluid is supplied from the constant pressure supplying path to the processing chamber with the predetermined pressure, and when the pressure of the processing chamber reaches a predetermined value, the substrate processing fluid is supplied from the boosted pressure supplying path to the processing chamber with a boosted pressure to increase the internal pressure of the processing chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
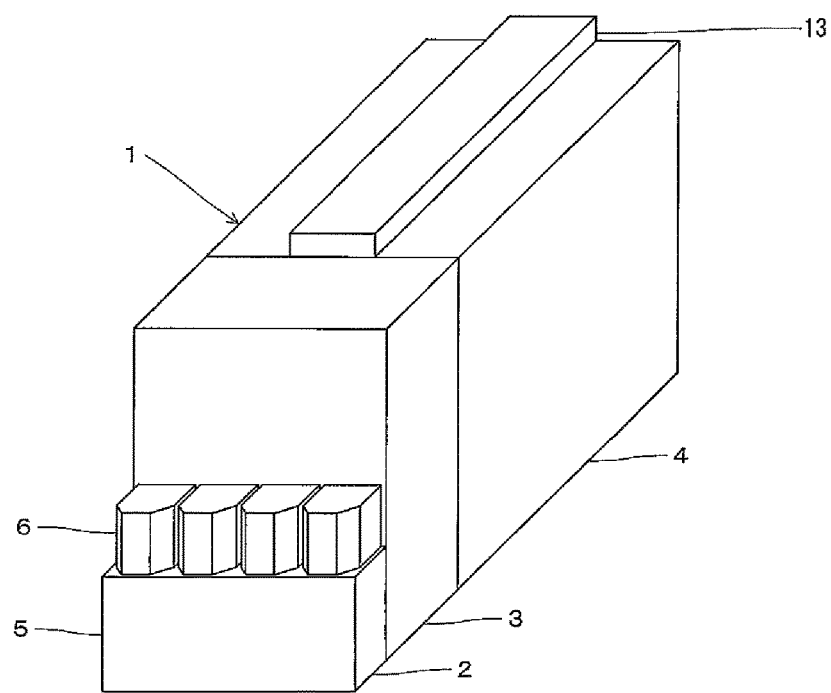
FIG. 1 is a perspective view illustrating a substrate processing apparatus according to a first exemplary embodiment of the present disclosure.

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

The present disclosure is made in an effort to improve the yield of the substrate processing apparatus by preventing the surface of the substrate from being contaminated when the dry processing for the substrate is performed in the supercritical state or the subcritical state.

Further, another object of the present disclosure is to provide a substrate processing apparatus in which foreign matter within the fluid passing the fluid supplying path accompanying the state change is removed and the fluid is supplied to the processing chamber where the substrate is processed, a fluid supplying method, and a storage medium that stores the method.

In an aspect of the present disclosure, provided is a substrate processing apparatus including: a processing chamber configured to process a substrate; a fluid supply source configured to supply a substrate processing fluid used in processing for the substrate in a predetermined pressure; a constant pressure supplying path configured to supply the substrate processing fluid from the fluid supply source to the processing chamber in a predetermined pressure without boosting the pressure of the substrate processing liquid; a boosted pressure supplying path configured to boost the pressure of the substrate processing fluid from the fluid supply source into a predetermined pressure by a booster mechanism and supply the pressure boosted substrate processing fluid to the processing chamber; and a control unit configured to switch over the constant pressure supplying path and the boosted pressure supplying path. The control unit may control the substrate processing apparatus such that the substrate processing fluid is supplied from the constant pressure supplying path to the processing chamber with the predetermined pressure, and when the pressure of the processing chamber reaches a predetermined value, the substrate processing fluid is supplied from the boosted pressure supplying path to the processing chamber with a boosted pressure to increase the internal pressure of the processing chamber.

Further, the processing chamber is controlled such that the surface of the substrate is subjected to a dry processing by removing the liquid attached to the surface of the substrate after pressurizing the liquid attached on the surface of the substrate with the substrate processing fluid to change the substrate processing liquid into a supercritical state or a subcritical state. The control unit may control such that the internal pressure of the processing chamber is increased up to a pressure where the liquid attached to the surface of the substrate becomes the supercritical state or the subcritical state.

Further, the processing chamber may be controlled such that the surface of the substrate is subjected to a dry processing by removing the liquid attached to the surface of the substrate after substituting the liquid with the substrate processing fluid that is in a supercritical state or a subcritical state. The control unit may control such that the internal pressure of the processing chamber is increased up to a pressure where the substrate processing fluid becomes the supercritical state or the subcritical state Further, the booster mechanism may be constituted by a cooler that cools the substrate processing fluid to change the substrate processing fluid into a liquid, and a pump that boosts the liquefied substrate processing fluid to a predetermined pressure and delivers the pressurized substrate processing fluid.

Further, the booster mechanism may be constituted by a cooler that cools the substrate processing fluid to change the substrate processing fluid into a liquid; a sealed chamber that stores the liquefied substrate processing fluid in a sealed state; and a heater that heats the sealed chamber so that the pressure of the stored substrate processing fluid reaches a predetermined pressure.

Further, the sealed chamber may be constituted by a double structure where an outer chamber is provided in the peripheral of an inner chamber.

Further, the sealed chamber may accommodate an oxidation catalyst therein.

Further, a filter may be installed in the constant pressure supplying path and/or the boosted pressure supplying path, a heater is provided at the upstream side of the filter, and a pipe disposed at the downstream side of the filter and connected to the processing chamber is either insulated or heated.

In addition, in another aspect of the present disclosure, provided is a substrate processing method including: supplying a substrate processing fluid supplied from a fluid supply source in a predetermined pressure to a processing chamber through a constant pressure supplying path in a constant pressure without boosting the pressure of the substrate processing liquid; after the internal pressure of the processing chamber reaches a predetermined pressure, boosting the pressure of the substrate processing fluid supplied from the fluid supply source to a predetermined pressure with a booster mechanism; and supplying the pressure boosted substrate processing fluid to the processing chamber, thereby increasing the internal pressure of the processing chamber.

The substrate processing method may further include: making the internal pressure of the processing chamber to be a pressure where the liquid attached to the surface of the substrate becomes a supercritical state or a subcritical state by the pressure of the substrate processing fluid supplied to the processing chamber, and subjecting the surface of the substrate to a dry processing by removing the liquid attached to the surface of the substrate after pressurizing the liquid with the substrate processing fluid to change the fluid into the supercritical state or the subcritical state.

The substrate processing method may further include: making the internal pressure of the processing chamber to be a pressure where the substrate processing fluid becomes the supercritical state or subcritical state, and subjecting the surface of the substrate to a dry processing by removing the liquid attached to the surface of the substrate after substituting the liquid with the substrate processing fluid so that the fluid becomes the supercritical state or subcritical state.

The substrate processing method may further include: storing the substrate processing fluid in a sealed chamber in a sealed state using the booster mechanism after cooling the substrate processing fluid to liquefy, and boosting the pressure of the stored substrate processing fluid in a predetermined pressure by heating.

The substrate processing method may further include providing a filter in the constant pressure supplying path and/or the boosted pressure supplying path, providing a heater at the upstream side of the filter, and either insulating or heating a pipe provided at the downstream side of the filter to be connected to the processing chamber.

Meanwhile, in yet another aspect of the present disclosure, provided is substrate processing apparatus including: a processing chamber configured to process a substrate by a supercritical fluid or a subcritical fluid; a fluid supplying unit configured to supply a fluid to the processing chamber; a fluid supplying path configured to connect the fluid supplying unit with the processing chamber, and after a gas state raw fluid from the fluid supplying unit passes, the raw fluid passes after changing into a supercritical state or a subcritical state; a first filter provided in the fluid supplying path and configured to remove foreign matter within the fluid; and a second filter provided at the downstream side of the first filter in the fluid supplying path in order to remove an aggregated body of foreign matter adsorbed to the first filter when the gas state raw fluid passes the first filter, and the particle size of the foreign matter capable of penetrating the second filter is smaller than the particle size of the foreign matter capable of penetrating the first filter when compared by passing the fluid of the liquid state, the supercritical state and the subcritical state.

The above-described substrate processing apparatus may have the following features:

(a) When compared by passing the fluid in the gas state, the particle size of the foreign matter adsorbed and removed by the first filter is equal to or less than the particle size of the foreign matter adsorbed and removed by the second filter.

(b) A heating mechanism that heats the inside of the fluid supplying path is provided in the fluid supplying path such that the fluid supplied to the processing chamber is directly changed from the gas state into the supercritical state or the subcritical state as the pressure within the fluid supplying path is increased. Alternatively, the raw fluid passing the fluid supplying path may be changed from the gas state into the supercritical state or the subcritical state after going through the liquid state.

(c) The raw fluid passing the fluid supplying path may be made by evaporating the fluid supplied in the liquid state, the supercritical state or the subcritical state from the fluid supplying unit.

Further, in yet another aspect of the present disclosure, provided is a substrate processing apparatus including: a processing chamber configured to process a substrate by a supercritical fluid or a subcritical fluid; a fluid supplying unit configured to supply a fluid to the processing chamber; a first fluid supplying path and a second fluid supplying path each configured to be connected to the fluid supplying unit and the processing chamber; a first filter provided in the first fluid supplying path and configured to remove foreign matter in a gas state fluid; a second filter provided in the second fluid supplying path and configured to remove foreign matter in a liquid state fluid, a supercritical state fluid or a subcritical state fluid; a fluid path switching unit configured to switch over the first fluid supplying path and the second fluid supplying path in which the fluid supplied from the fluid supplying unit passes between the first fluid supplying path and the second fluid supplying path; and a control unit configured to output a control signal to the fluid path switching unit such that the fluid is supplied to the processing chamber through the first fluid supplying path during a period where the raw fluid supplied from the fluid supplying unit passes in the gas state and the fluid is supplied to the processing chamber through the second fluid supplying path during a period where the fluid obtained from the raw fluid passes in the liquid state, the supercritical state or the subcritical state.

In the present disclosure, since the mixing of the particles into the substrate processing fluid is suppressed, the contamination of the substrate may be suppressed to improve the yield of the substrate processing apparatus.

Further, in the present disclosure, in the fluid supplying path where the fluid supplied to the processing chamber passes in which the substrate is processed using the high-pressure fluid (supercritical fluid or subcritical fluid), provided are the first filter to remove the foreign matter within the fluid and the second filter provided at the downstream side of the first filter in order to remove aggregated foreign matters adsorbed to the first filter when the raw fluid in the gas state passes. For that reason, even when aggregated foreign matters adsorbed to the first filter when gas passes outputs into the liquid or the fluid in a high pressure, the aggregated foreign matters may be collected by the second filter at the downstream side and the introduction of the aggregated foreign matters into the processing chamber may be suppressed.

First Exemplary Embodiment

Hereinafter, specific configurations of a substrate processing apparatus according to the present disclosure and a substrate processing method used in the substrate processing apparatus will be described with reference to accompanying drawings.

Figure 2:
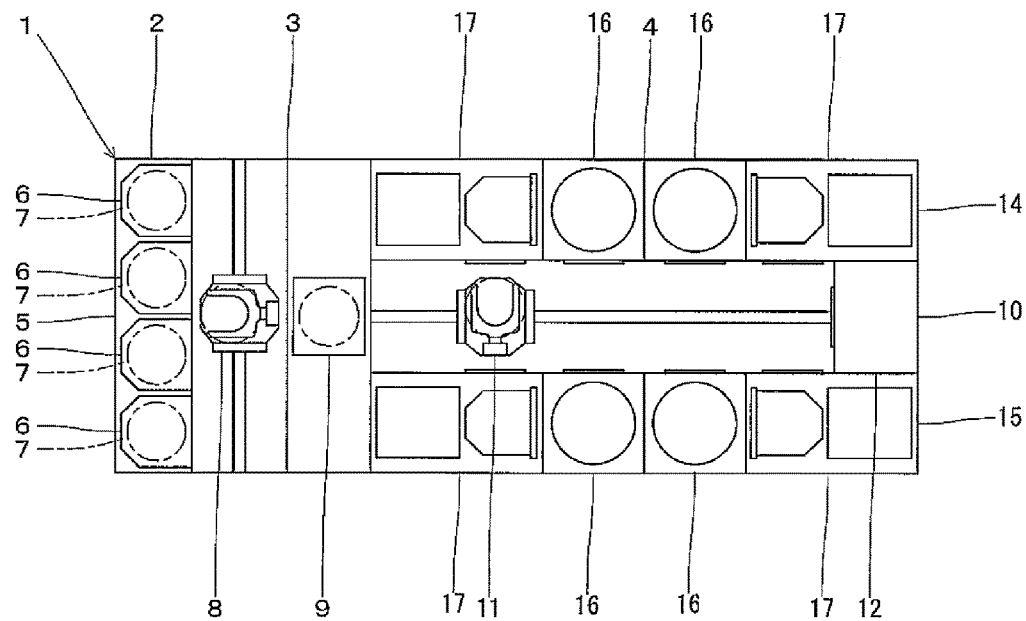
FIG. 2 is a schematic plan view of the substrate processing apparatus in FIG. 1.

Referring to FIGS. 1 and 2, a substrate processing apparatus 1 includes a substrate carry-in/carry-out part 2 formed in the front end portion thereof, a substrate transport part 3 formed in the rear side of substrate carry-in/carry-out part 2, and a substrate processing part 4 formed in the rear side of substrate transport part 3.

Substrate carry-in/carry-out part 2 is configured to dispose a plurality of carriers 6 (e.g., four in the present embodiment) side by side on a substrate carrying-in/carry-out table 5. Each of carriers 6 accommodates a plurality of substrates 7 (e.g., 25 semiconductor wafers in the present embodiment).

Substrate transport part 3 accommodates a substrate transport device 8 in the front side thereof, and substrate transfer tables 9 in a vertical direction in the rear side thereof. In substrate transport part 3, substrate 7 is transported between one of carriers 6 disposed on substrate carry-in/carry-out part 2 and transfer table 9 that is one of upside or outside using substrate transport device 8.

In the center portion of substrate processing part 4, substrate transport chambers 10 are disposed side by side in a vertical direction extending in a forward and rearward direction. In each of substrate transport chambers 10, a substrate transport device 11 is accommodated, the front end portion is communicated with substrate transfer table 9 of substrate transport part 3, a substrate cooling device 12 that cools substrate 7 is installed in the rear end portion thereof, and an air blower 13 is installed in the ceiling portion thereof.

Further, in substrate processing part 4, substrate processing chambers 14, 15 are disposed side by side in a vertical direction extending in a forward and rearward direction in the both sides of substrate transport chamber 10. In the inside of each of substrate processing chambers 14, 15, substrate liquid processing devices 16, 16 that liquid-process substrate 7 with a processing liquid are disposed in a forward and rearward direction in the middle portion thereof, and substrate dry processing devices 17, 17 that dry-process substrate 7 in a supercritical state or a subcritical state are disposed in the front/rear end portions thereof.

In substrate processing part 4, substrate 7 is transported from substrate transfer table 9 to substrate liquid processing device 16 using substrate transport device 11 and then the liquid processing is performed. In the liquid processing, a cleaning processing is performed by supplying a chemical solution such as, for example, hydrogen fluoride to the surface of substrate 7, and then, a rinse processing is performed by supplying a rinse liquid such as, for example, a deionized water to the surface of substrate 7. Further, an anti-dry processing is performed by supplying an anti-dry liquid such as, for example, isopropyl alcohol and hydrofluoroether to the surface of substrate 7 to coat the surface of substrate 7 with the anti-dry liquid. Then, substrate 7 is transported from substrate liquid processing device 16 to substrate dry processing device 17 to perform the dry processing in a state where the surface of substrate 7 is coated with the anti-dry liquid (e.g., isopropyl alcohol). The dry processing will be described later. Then, substrate 7 is transported from substrate dry processing device 17 to substrate cooling device 12 to be subjected to a cooling processing, and then, transported from substrate cooling device 12 to substrate transfer table 9.

Figure 3:
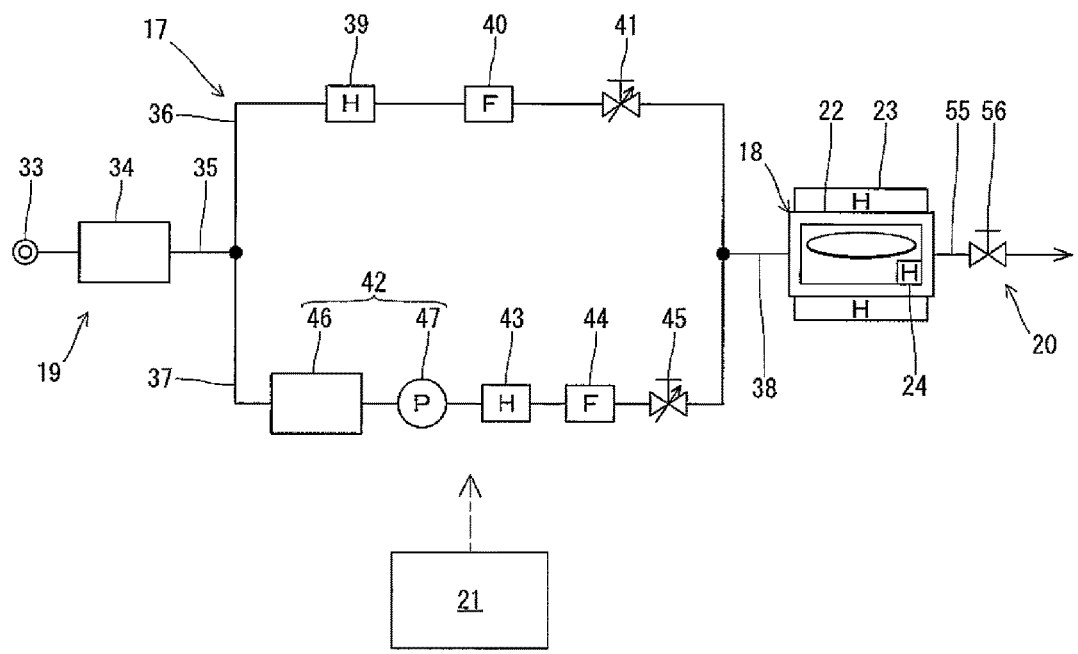
FIG. 3 is a block diagram illustrating the substrate processing apparatus according to the first exemplary embodiment.
Figure 4:
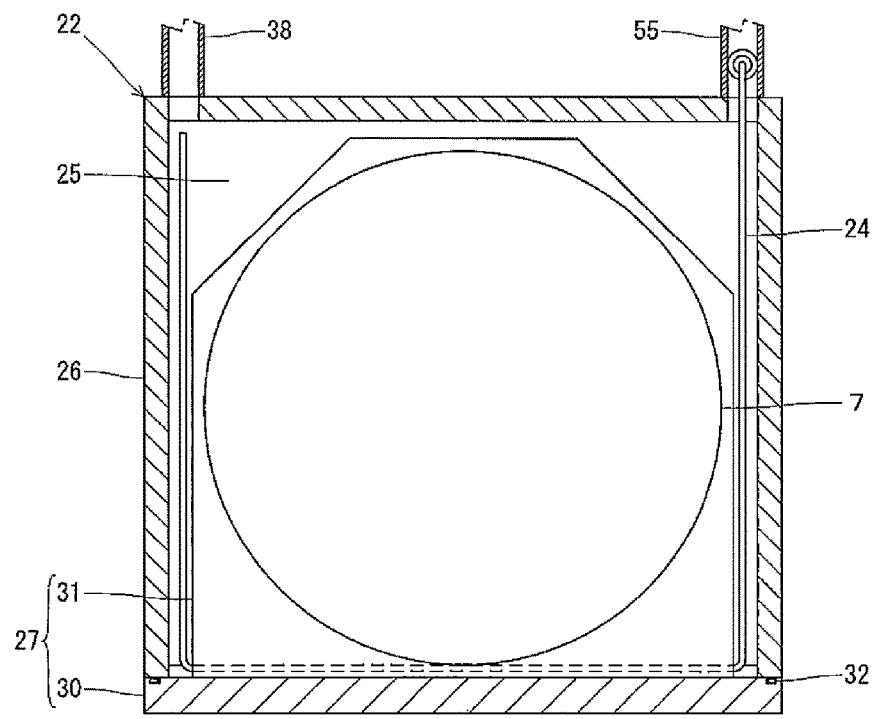
FIG. 4 is a cross-sectional plan view illustrating a processing chamber.
Figure 5:
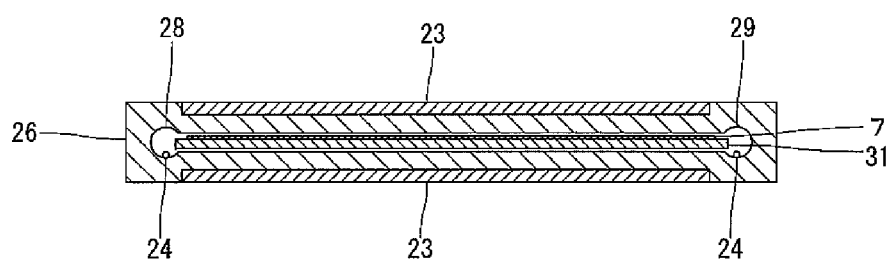
FIG. 5 is a cross-sectional front view of the processing chamber in FIG. 4.
Figure 6:
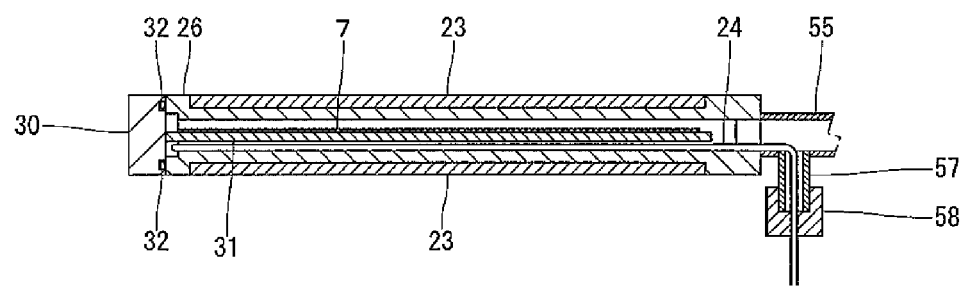
FIG. 6 is a cross-sectional side view of the processing chamber in FIG. 4.

As illustrated in FIG. 3, substrate dry processing device 17 includes a dry processing unit 18 that dries substrate 7, a fluid supplying unit 19 that supplies substrate processing fluid in the high pressure (e.g., carbon dioxide gas) to dry processing unit 18, and a fluid discharging unit 20 that discharges, for example, the substrate processing fluid from dry processing unit 18. A control unit (a computer) 21 controls dry processing unit 18, fluid supplying unit 19, and fluid discharging unit 20. Control unit 21 controls dry processing unit 18, fluid supplying unit 19 and fluid discharging unit 20 of substrate dry processing device 17 according to a substrate processing program recorded in a recording medium. Meanwhile, control unit 21 controls the entire substrate processing apparatus 1 including substrate dry processing device 17.

As illustrated in FIGS. 3 to 6, dry processing unit 18 is provided with a processing chamber 22 of a rectangular box shape which is connected between fluid supplying unit 19 and fluid discharging unit 20. An indirect heater 23 that indirectly heats the inside of processing chamber 22 through processing chamber 22 is provided in the outside of processing chamber 22, and a direct heater 24 that directly heats the inside of processing chamber 22 is provided in the inside of processing chamber 22.

In processing chamber 22, a substrate transport body 27 capable of being moved slidable in a forward and rearward direction which is attached to the front end of a chamber body 26 that forms a processing space 25 where substrate 7 is processed.

In processing body 26, a fluid supplying path 28 and a fluid discharging path 29 are formed which extend in a forward and rearward direction in the left and right ends of processing space 25, fluid supplying unit 19 is connected to the rear end portion of fluid supplying path 28, and fluid discharging unit 20 is connected to the rear end portion of fluid discharging path 29. Therefore, in processing chamber 22, the fluid supplied from fluid supplying unit 19 is supplied to processing space 25 from fluid supplying path 28, and the fluid after completing the processing is discharged to fluid discharging unit 20 from fluid discharging path 29.

In substrate transport body 27, a substrate disposing table 31 on which substrate 7 is disposed is attached to the rear side of a cover 30 that seals the front end opening of processing space 25. Therefore, in processing chamber 22, substrate 7 is transported between substrate transport device 11 and substrate disposing table 31 in a state where substrate transport body 27 is moved to the front side and processing space 25 is opened, the dry processing for substrate 7 is performed in a state where substrate transport body 27 is moved to the rear side and processing space 25 is closed. Meanwhile, a spring type packing 32 of which cross-section abutting to the front end surface of chamber body 26 is substantially U shape is attached to the rear surface of cover 30. In at least chamber body side surface of packing 32 or internal surface of processing chamber 22, gold plating or platinum plating is performed on a basic material such as, for example, stainless steel that constitutes chamber body 26.

Indirect heater 23 is constituted by heater plates attached to the top and bottom surfaces of chamber body 26. Indirect heater 23 heats the upper and lower walls of chamber body 26 by the heater plates to indirectly heat the inside of processing space 25 through the upper and lower walls of chamber body 26. Indirect heater 23 is used to heat the inside of processing space 25 to become a supercritical state or a subcritical state.

Direct heater 24 is constituted by sheath heater attached to the front end opening and fluid supplying path 28 and fluid discharging path 29 which are formed in processing space 25 inside chamber body 26. Direct heater 24 directly heats the inside of processing space 25 by the sheath heater. Direct heater 24 is used to prevent the fluid from being attached to substrate 7 by being liquefied into mist by the temperature down according to the rapid pressure down, when the fluid in the supercritical state or subcritical state (substrate processing fluid or anti-dry liquid) is discharged from processing chamber 22 by fluid discharging unit 20.

In fluid supplying unit 19, a purifying device 34 is connected to a fluid supply source 33 that supplies substrate processing fluid in a predetermined pressure, the upstream ends of constant pressure supplying path 36 and boosted pressure supplying path 37 are connected to a delivery pipe 35 of purifying device 34, the downstream ends of constant pressure supplying path 36 and boosted pressure supplying path 37 are connected to a supply pipe 38, and supply pipe 38 is connected to fluid supplying path 28 of processing chamber 22.

Constant pressure supplying path 36 supplies the substrate processing fluid from fluid supply source 33 to processing chamber 22 in a constant pressure without boosting the substrate processing fluid. Here, the constant pressure is equal to or less than the pressure of the substrate processing fluid supplied from fluid supply source 33. It is not limited to a case where the fluid is supplied in the pressure from fluid supply source 33 at it is, but the fluid may be supplied in a pressure which is depressurized by, for example, a regulator.

A heater 39, a filter 40, and a flow rate controller 41 are connected in this order from the upstream side in constant pressure supplying path 35.

Constant pressure supplying path 36 removes the impurities by causing the substrate processing fluid to pass filter 40 in a state where the fluid is heated by heater 39, and supplies the substrate processing fluid to processing chamber 22 in a flow rate set by flow rate controller 41.

Boosted pressure supplying path 37 boosts the substrate processing fluid from fluid supply source 33 in a predetermined pressure by a booster mechanism 42 and supplies the boosted substrate processing fluid to processing chamber 22. Here, the predetermined pressure is higher than the pressure of the substrate processing fluid supplied from fluid supply source 33.

Booster mechanism 42, a heater 43, a filter 44, and a flow rate controller 45 are connected in this order from the upstream side in boosted pressure supplying path 37. Booster mechanism 42 is constituted by a cooling device 46 and a pump 47.

Boosted pressure supplying path 37 delivers the substrate processing fluid by cooling the substrate processing fluid by cooling device 46 to be liquid state and boosting the fluid with a predetermined pressure by pump 47, and supplies the substrate processing fluid to processing chamber 22 in a flow rate set by flow rate controller 45. Boosted pressure supplying path 37 removes the impurities by causing the substrate processing fluid to pass filter 44 in a state where the substrate processing fluid is heated by heater 43.

Constant pressure supplying path 36 and boosted pressure supplying path 37 are switched over by controlling flow rate controllers 41, 45 using control unit 21, and the substrate processing fluid is supplied to processing chamber 22 from one of paths 36, 37. At that time, there is a concern that some impurities such as, for example, hydro-carbon resolved in the substrate processing fluid is precipitated according to the temperature decrease of the substrate processing fluid after the fluid passes filters 40, 44. For that reason, the temperature of the substrate processing fluid may be prevented from being lowered by insulating or heating the substrate processing fluid by winding insulator or heater on the pipe to processing chamber 22 from the downstream side than filters 40, 44 in constant pressure supplying path 36 or boosted pressure supplying path 37.

Figure 7:
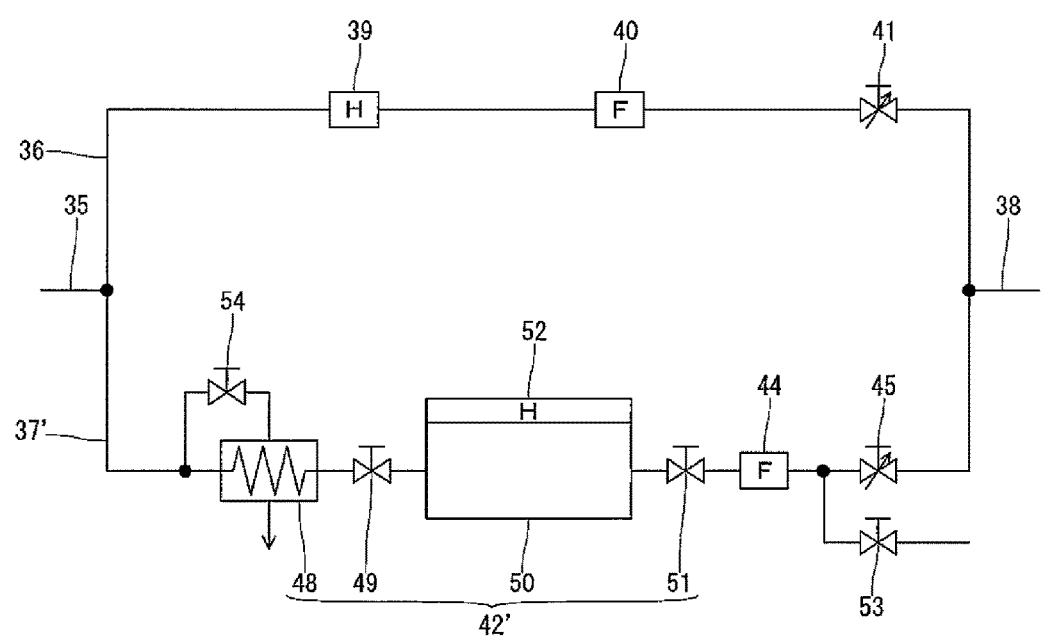
FIG. 7 is a block diagram illustrating a configuration of another boosted pressure supplying path.

In boosted pressure supplying path 37, booster mechanism 42 is constituted by cooling device 46 and pump 47, but it is not limited thereto. For example, in a boosted pressure supplying path 37' as illustrated in FIG. 7, a cooler 48, an input opening/closing valve 49, a sealed chamber 50, and an output opening/closing valve 51 are connected in this order from the upstream side as a booster mechanism 42'. Sealed chamber 50 is provided with a heater 52, and an atmospheric air opening valve 53 is connected to flow rate controller 45 in parallel.

In booster mechanism 42', the substrate processing fluid is cooled by cooler 48 to be stored in sealed chamber 50 by closing output opening/closing valve 51 and opening input opening/closing valve 49, the temperature and pressure of the substrate processing fluid are increased by being heated by heater 52 in a state where the substrate processing fluid is sealed in sealed chamber 50 by closing input opening/closing valve 49, and then, the boosted substrate processing fluid is supplied from sealed chamber 50 to processing chamber 22 by opening output opening/closing valve 51.

Booster mechanism 42' is configured to cool the substrate processing fluid that passes the inside of cooler 48 using the substrate processing fluid of which temperature is lowered using depressurization, by branching a part of the substrate processing fluid at the upstream side of cooler 48 and supplying the fluid to the peripherals of cooler 48 through opening/closing valve 54 in a state where the fluid is depressurized in an atmospheric pressure.

In booster mechanism 42', the inside of sealed chamber 50 may be configured as a double structure in which an outer chamber is disposed in outer peripheral of an inner chamber in a concentric circles to decrease the heat loss. Further, sealed chamber 50 may be configured to accommodate oxidation catalyst therein and decompose and remove the impurities such as, for example, hydrocarbon into carbon dioxide or water. At that time, oxygen that activates the oxidation catalyst may be supplied into sealed chamber 50.

As illustrated in FIG. 3, fluid discharging unit 20 is configured such that discharging pipe 55 connected to fluid discharging path 29 of processing chamber 22 is connected to a discard mechanism in the outside through opening/closing valve 56. Accordingly, fluid discharging unit 20 discards the substrate processing fluid from the inside of processing chamber 22 to the discard mechanism in the outside by opening opening/closing valve 56. Meanwhile, a branch pipe 57 is connected to the base end portion of discharging pipe 55, direct heater 24 is wired from branch pipe 57 to the outside, and the end of the branch pipe 57 is sealed by a seal body 58. As described above, branch pipe 57 branched from discharging pipe 55 is sealed, and even though particles such as, for example, dust are generated in the sealed portion, the particles may be discharged from discharging pipe 55 at the time when discharging the fluid. Accordingly, there is no concern that substrate 7 is contaminated.

Substrate processing apparatus 1 is configured as described above, and is controlled by control unit 21. Accordingly, substrate 7 is subject to a liquid processing by substrate liquid processing device 16, and then, is subjected to a dry processing by substrate dry processing device 17.

In the dry processing, substrate 7 is carried from substrate liquid processing device 16 to processing chamber 22 of substrate dry processing device 17 in a state where the surface of substrate 7 is coated with the anti-dry liquid (e.g., isopropyl alcohol) and is subjected to the dry processing in processing chamber 22.

At that time, in substrate processing apparatus 1, substrate processing fluid in the high pressure is supplied into processing chamber 22 in a state where opening/closing valve 56 is closed, and the internal pressure of processing chamber 22 is increased up to a pressure where the anti-dry liquid attached (coated) to the surface of substrate 7 becomes the supercritical state or subcritical state by the action of the pressure of the substrate processing fluid in the high pressure. Then, indirect heater 23 increases the internal temperature of processing chamber 22 to change the anti-dry liquid attached to the surface of substrate 7 into the supercritical state or subcritical state. Then, the substrate processing fluid and the liquid in the supercritical state or the subcritical state are discharged from processing chamber 22 by opening opening/closing valve 56. Since the liquid is supercritical state or subcritical state in the surface of substrate 7, the surface tension is not applied thereto, and thus, the surface pattern of the substrate may be prevented from being collapsed.

In substrate processing apparatus 1, it is not limited to a case where the anti-dry liquid attached to the surface of substrate 7 becomes a supercritical or subcritical state to be dried, and the substrate processing fluid may be subjected to a dry processing in the supercritical or subcritical state. In that case, high pressure of substrate processing fluid is supplied into processing chamber 22 heated by indirect heater 23 in a state where opening/closing valve 56 is closed, the internal pressure of processing chamber 22 is increased up to a pressure where the substrate processing fluid becomes the supercritical or subcritical state. Then, the anti-dry liquid attached (coated) to the surface of substrate 7 is substituted with a substrate processing fluid which is supercritical state or subcritical state. Then, the substrate processing fluid and the liquid in the supercritical state or subcritical state are discharged from processing chamber 22 by opening opening/closing valve 56. Even in the case, since the substrate processing fluid is supercritical state or subcritical state in the surface of substrate 7, the surface tension is not applied thereto, and thus, the surface pattern of the substrate may be prevented from being collapsed.

Substrate processing apparatus 1 is controlled to increase the internal pressure of processing chamber 22 by supplying the substrate processing fluid of a constant pressure to processing chamber 22 from constant pressure supplying path 36 first, and supplying the substrate processing fluid boosted by booster mechanism 42 to processing chamber 22 from boosted pressure supplying path 37 when the internal pressure of processing chamber 22 becomes a predetermined pressure, when the substrate processing fluid is supplied to processing chamber 22 regardless of the above-described dry processing.

As described above, in substrate processing apparatus 1, the substrate processing fluid is not always supplied to processing chamber 22 via booster mechanism 42. The substrate processing fluid may be supplied to processing chamber 22 from constant pressure supplying path 36 without passing booster mechanism 42 to increase the internal pressure of processing chamber 22, and then, the substrate processing fluid may be supplied to processing chamber 22 from boosted pressure supplying path 37 via booster mechanism 42. For that reason, in the above-described substrate processing apparatus 1, the frequency that the substrate processing fluid passes booster mechanism 42 may be decreased to reduce the chance where particles are mixed into the substrate processing fluid in booster mechanism 42. Accordingly, the contamination of substrate 7 may be suppressed to improve the yield of substrate processing apparatus 1.

Specifically, in substrate processing apparatus 1, filters 40, 44 are installed in constant pressure supplying path 36 or boosted pressure supplying path 37, heaters 39, 43 are installed at the upstream side of filters 40, 44, and the pipes connected to processing chamber 22 at the downstream side of filters 40, 44 are insulated or heated. In that case, the collection efficiency of filters 40, 44 may be increased via the heating by heaters 39, 43, the impurities such as, for example, hydrocarbon resolved in the substrate processing fluid which is not collected by filters 40, 44 may be prevented from being precipitated according to the decreased temperature of the substrate processing fluid after passing the filters 40, 44. Accordingly, the contamination of substrate 7 may be suppressed to increase the yield of substrate processing apparatus 1.

Further, in a case where booster mechanism 42' that boosts using a chemical state change with a configuration including cooler 48, sealed chamber 50 and heater 52 is used other than booster mechanism 42 using pump 47 which is a mechanical structure, the particles may be prevented from being mixed at the time of passing booster mechanism 42', and thus, substrate 7 may be prevented from being contaminated to improve the yield of substrate processing apparatus 1.

Second Exemplary Embodiment

As a liquid processing system including the substrate processing apparatus of the present disclosure, a liquid processing system 1001 will be described which includes: a liquid processing device 1002 that performs a liquid processing by supplying various processing liquids to a wafer W which is a substrate; and a supercritical processing device 1003 that removes the anti-dry liquid attached to wafer W after the liquid processing by contacting with a supercritical fluid (high-pressure fluid). Supercritical processing device 1003 corresponds to a substrate processing apparatus of the present exemplary embodiment.

Figure 8:
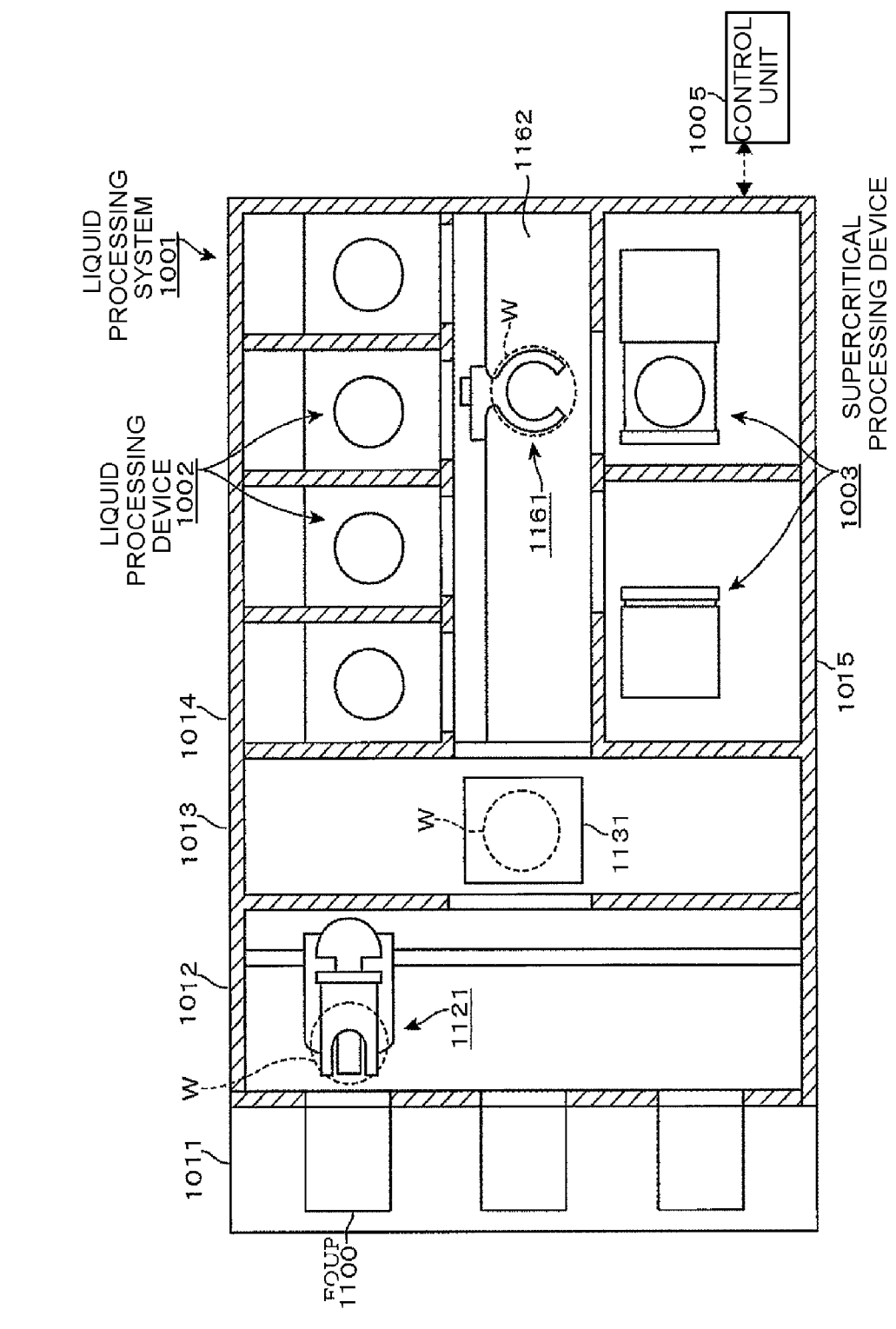
FIG. 8 is a transversely cross-sectional plan view of a liquid processing system according to a second exemplary embodiment of the present disclosure.

FIG. 8 is a plan view illustrating the entire configuration of liquid processing system 1001, and the left side of FIG. 8 indicates the front side. In liquid processing system 1001, a FOUP 1100 is disposed in a disposing part 1011, and a plurality of wafers W each having diameter of 300 mm and accommodated in FOUP 1100 are transferred between a liquid processing part 1014 and a supercritical processing part 1015 via a carry-in/carry-out part 1012 and transfer part 1013. The plurality of wafers W are then carried into a liquid processing device 1002 and a supercritical processing device 1003 in order, and a processing is performed to remove the liquid for liquid processing or anti-dry. In the figure, reference numeral 1121 indicates a first transporting mechanism that transports wafer W between FOUP 1100 and transfer part 1013, and reference numeral 1131 indicates a transfer rack that serves as a buffer on which wafer W transported among carry-in/carry-out part 1012, liquid processing part 1014 and supercritical processing part 1015, is temporarily disposed.

Liquid processing part 1014 and supercritical processing part 1015 are disposed with a transport space 1162 for wafer W therebetween, and the transport space 1162 extends in a forward and rearward direction from an opening with transfer part 1013. In liquid processing part 1014 provided in the left side of transport space 1162 when viewed from the front side, for example, four liquid processing devices 1002 are arranged along transport space 1162. In supercritical processing part 1015 provided in the right side of transport space 1162, for example, two supercritical processing devices 1003 are arranged along transport space 1162.

Wafer W is transported among liquid processing device 1002, supercritical processing device 1003 and transfer part 1013 by a second transporting mechanism 1161 disposed in transport space 1162. Here, the number of liquid processing device 1002 or supercritical processing device 1003 disposed in liquid processing part 1014 or supercritical processing part 1015 is appropriately selected according to, for example, the number of sheets of wafer W to be processed per unit time or the difference of processing times in liquid processing device 1002 and supercritical processing device 1003. The optimal layout of liquid processing device 1002 and supercritical processing device 1003 is selected according to the number of arrangement of liquid processing device 1002 or supercritical processing device 1003.

Figure 9:
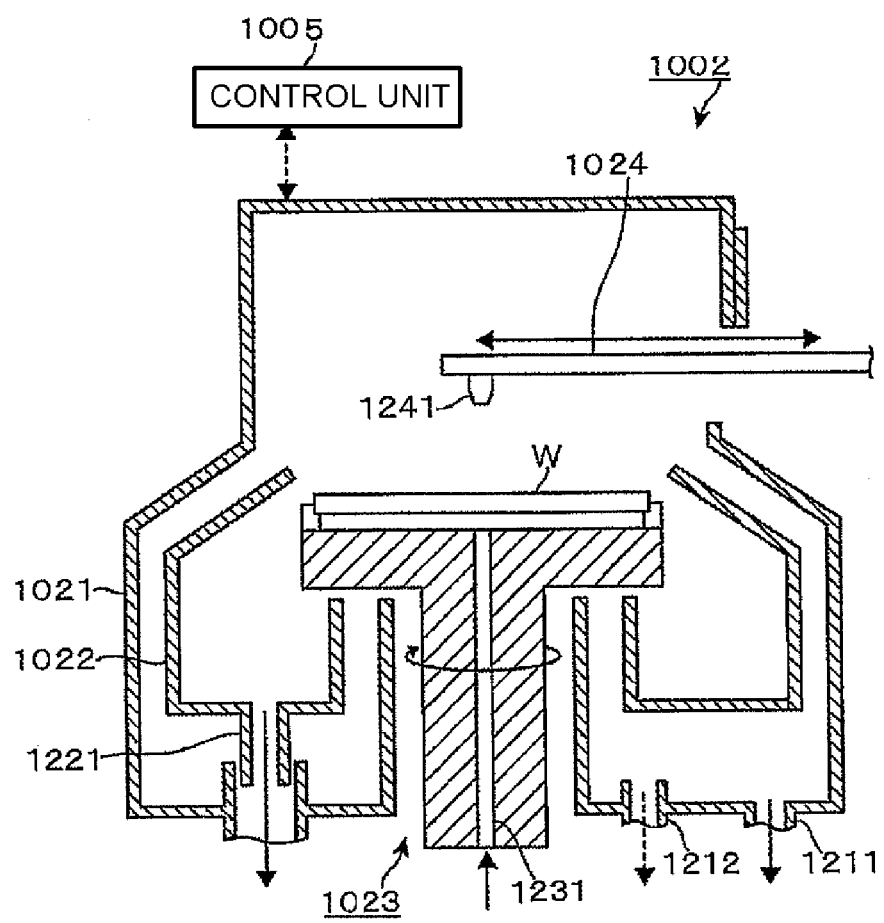
FIG. 9 is a vertical side view of a liquid processing device provided in the liquid processing system.

Liquid processing device 1002 is configured as, for example, a single-type cleaning device to clean wafer W one by one using a spin cleaning. As illustrated in FIG. 9 which is a vertical cross-sectional view, liquid processing device 1002 includes: an outer chamber 1021 that forms a processing space; a wafer holding mechanism 1023 disposed within the outer chamber and configured to rotate wafer W about a vertical axis while holding wafer W horizontally; an inner cup 1022 disposed to surround wafer holding mechanism 1023 at the side peripherals thereof and configured to receive the liquid scattered from wafer W; and a nozzle arm 1024 configured to be moved between a position above wafer W and a position which is retreated therefrom and having a nozzle 1241 at the fore end thereof.

Liquid processing device 1002 performs various process such as, for example, removing of particles or organic contaminants using an SC1 solution (a mixture of ammonium hydroxide and hydrogen peroxide) which is an alkaline chemical solution, rinse cleaning using deionized water (DIW), removing of native oxide layers using a hydrofluoric acid aqueous solution (hereinafter, diluted hydrofluoric acid (DHF)) which is an acidic chemical solution, and rinse cleaning using DIW.

Further, a chemical solution supplying path 1231 is formed even in the inside of wafer holding mechanism 1023, and the cleaning of the rear surface of wafer W may be performed by the chemical solution and rinse liquid supplied therefrom. An exhausting port 1212 that exhausts the inner atmosphere or drain ports 1221, 1211 that discharge the liquid scattered from wafer W may be provided in the bottom portion of outer chamber 1021 or inner cup 1022.

Wafer W after completing the liquid processing in liquid processing device 1002 is transported to supercritical processing device 1003 by second transport mechanism 1161 in a state where the surface thereof is covered with isopropyl alcohol (IPA) serving as the anti-dry fluid. In supercritical processing device 1003, a processing is performed which removes the IPA attached to the surface by contacting wafer W with $CO_2$ in a supercritical state to dry wafer W. Hereinafter, the configuration of supercritical processing device 1003 will be described with reference to FIGS. 10 and 11.

Supercritical processing device 1003 includes a processing chamber 1031 in which a processing to remove the IPA attached to the surface of wafer W is performed using supercritical $CO_2$. Supercritical processing device 1003 also includes a $CO_2$ supply system 1030 that supplies the supercritical $CO_2$ to the processing chamber.

Figure 11:
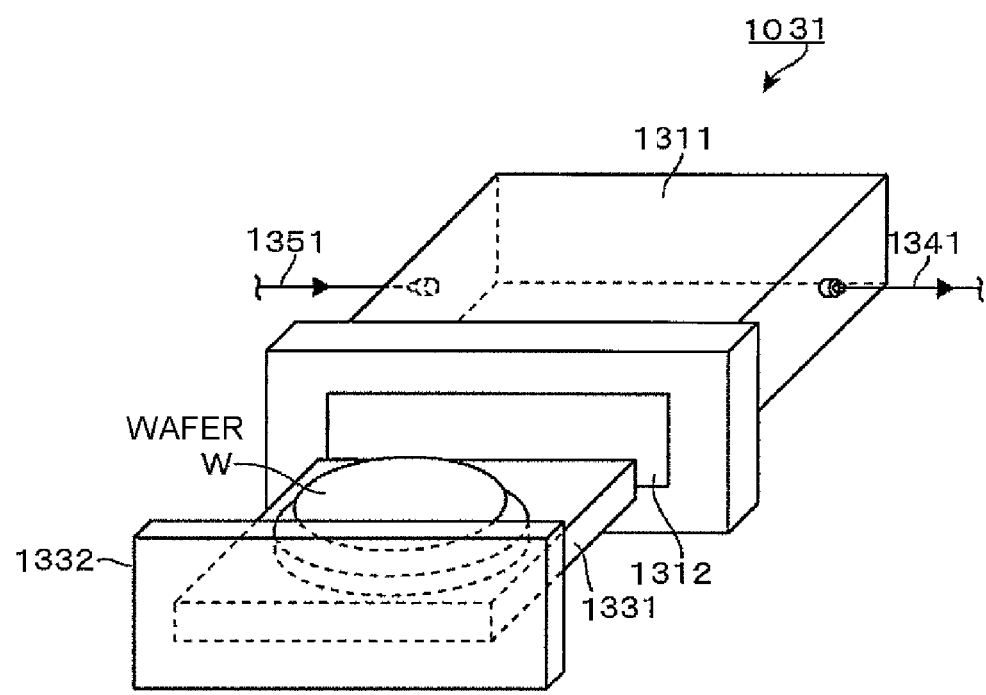
FIG. 11 is a perspective view illustrating the appearance of a processing chamber of the supercritical processing device.

Processing chamber 1031, as illustrated in FIG. 11, includes a case shape chamber body 1311 with an opening 1312 for carrying-in/carry-out wafer W, a holding plate 1331 that holds wafer W to be processed in a horizontal direction, and a cover member 1332 that supports holding plate 1331 and seals opening 1312 when wafer W is carried into chamber body 1311.

Chamber body 1311 is a chamber in which a processing space of, for example, 200 $cm^3$ to 10000 $cm^3$ capable of receiving wafer W of 300 mm in diameter is formed, and a $CO_2$ supplying line 1351 serving as a fluid supplying path that supplies liquid $CO_2$ into processing chamber 1031 and a discharging line 1341 that discharges the fluid within processing chamber 1031 are connected to the wall portion of chamber body 1311. Further, processing chamber 1031 is provided with a press mechanism (not illustrated) for sealing the processing space by strongly pushing cover member 1332 toward chamber body 1311 against the inner pressure caused by the processing fluid in the high pressure supplied into the processing space.

A heater 1322 constituted by, for example, a resistant heating element is provided in a chamber body 1311, and the temperature of wafer W within processing chamber 1031 may be heated to a temperature set in advance by heating chamber body 1311. Heater 1322 may change the heat quantity by the power supplied from a power supply unit 1321, and control the temperature within processing chamber 1031 to a temperature, for example, 50° C. which is higher than the critical temperature of $CO_2$ (31° C.) based on the detected result of the temperature obtained from a temperature detecting unit (not illustrated).

$CO_2$ supplying line 1351 connected to processing chamber 1031 is connected to a booster pump 1036 through opening/closing valve 1352 that opens/closes in accordance with the supply/stop of the pressurized fluid into processing chamber 1031, a second filter 1042, a first filter 1041, and an orifice 1043 for controlling the flow rate to prevent the rapid increase of the pressure at the downstream side of booster pump 1036. $CO_2$ supplying line 1351 corresponds to a fluid supplying path of the present exemplary embodiment.

Figure 10:
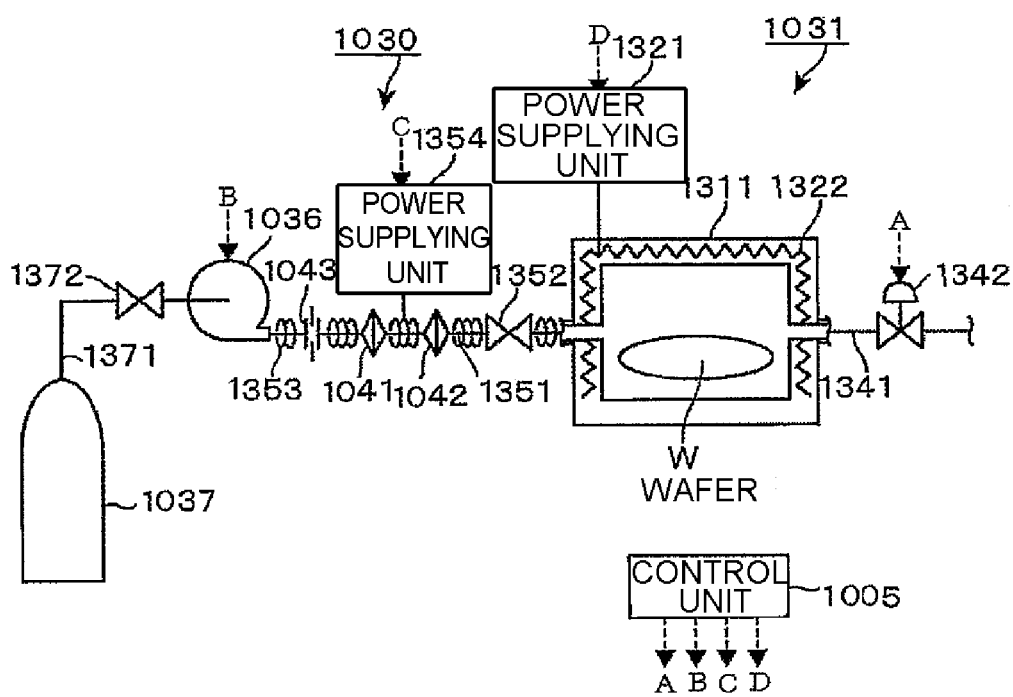
FIG. 10 is a schematic diagram of a supercritical processing device provided in the liquid processing system.

Booster pump 1036 serves to adiabatically compress, for example, $CO_2$ held in a liquid state within $CO_2$ supplying unit 1037 and deliver the $CO_2$ to processing chamber 1031 in a liquid state or a supercritical state, and adopts, for example, a syringe pump or a diaphragm pump. In FIG. 10, reference numeral 1371 indicates a $CO_2$ supplying line that supplies the $CO_2$ from $CO_2$ supplying unit 1037 to booster pump 1036, and reference numeral 1372 indicates an opening/closing valve thereof.

Next, first filter 1041 and second filter 1042 installed in $CO_2$ supplying line 1351 which is described above will be described. First filter 1041 installed in the upstream side of $CO_2$ supplying line 1351 is configured as a gas filter, and a sintered filter of a steel (manufactured by Japan Entegris, Wafergard® II SF) of which the collection efficiency of the particles having a particle size of 3 nm or more among the gas fluid (fluid in a gas state) is installed.

The type of filter material constituting first filter 1041 is not limited to the above described sintered filter (porous filter). For example, a fibrous filter which is formed by stacking minute glass fibers or a membrane filter made of a resin of porous membrane shape may be used as long as a sufficient pressure resistance is obtained.

In the filtering of gas fluid a small viscosity or density, two types of mechanisms are functioning: a collection by sieve effect in which particles having a particle size bigger than the gap of a filter material does not penetrate the gap to be collected, and a collection by adsorption effect in which particles having a particle size capable of penetrating the gap of the filter material is in contact with the filter material and is adsorbed (attached) to the surface of the filter material to be collected.

Figure 12A:
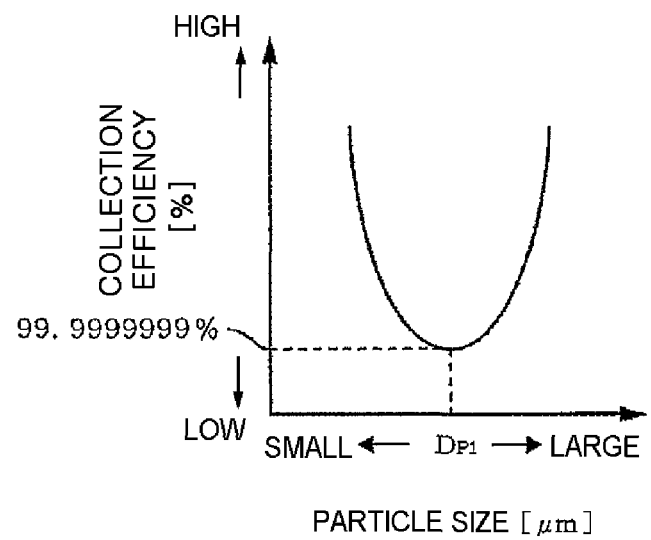
FIGS. 12A and 12B are explanatory views illustrating a relationship between fluid that flows through the filter and collection efficiency of particles, respectively.

Among those, the collection efficiency by the sieve effect becomes higher as the particle size is increased, while the collection efficiency by the adsorption effect becomes higher as the particle size is decreased. For that reason, the collection efficiency of first filter 1041 when the gas fluid passes has a curve in a valley shape which is bulging downward as illustrated in FIG. 12A. Further, a particle size $D_{P1}$ exists in which the collection efficiency becomes the minimum. In the present embodiment, first filter 1041 of which $D_{P1}$=3 mm is selected. However, the particle size where the collection efficiency becomes the minimum in first filter 1041 is not limited to a case where the particle size coincides with the above-described $D_{P1}$. For example, when it is known that the particle size of the particles included in $CO_2$ which are stored in $CO_2$ supplying unit 1037 is smaller than the above-described $D_{P1}$, the maximum particle size of the particles included in $CO_2$ becomes the particle size where the collection efficiency becomes the minimum.

Meanwhile, at the downstream side of liquid processing system 1, a second filter 1042 configured as a liquid filter (manufactured by Japan Entegris, Wafergard® SC) is installed. Second filter 1042 is a sintered filter in which the collection efficiency of the particles having a particle size of 65 nm or more in the liquid fluid or in the supercritical fluid is 97% or more. Further, second filter 1042 may have collection efficiency of 99.9999999% or more with respect to the particles having the particle size in the gas fluid of 3 nm or more. The type of the filter material constituting second filter 1042 is not limited to the sintered filter (porous filter). For example, a fibrous filter or a membrane filter may be used as long as a sufficient pressure resistance is obtained.

Figure 12B:
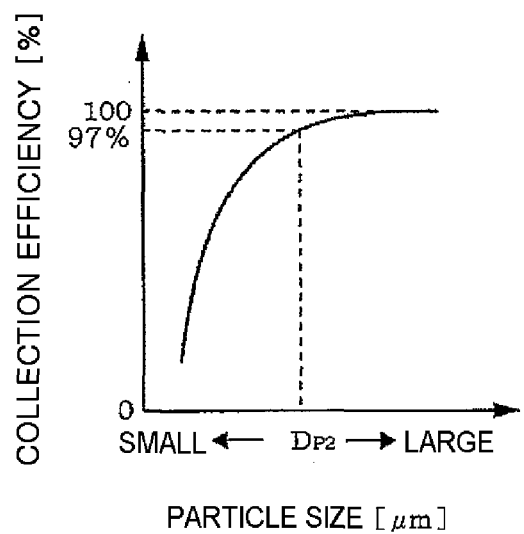

In a case of the liquid fluid or the supercritical fluid (fluid in a supercritical state) having a large viscosity or density compared to the gas fluid, the force that causes the particles to flow becomes stronger than the force that particles are adsorbed to the filtering material. Therefore, the collection by the sieve effect becomes the main. For that reason, the collection efficiency of liquid processing device 1002 when the liquid fluid passes is changed into about step shape as illustrated in FIG. 12B. For example, the minimum particle size of which collection efficiency becomes 97% or more (filtration precision, $D_{P2}$) becomes the above-described design value. In the present embodiment, second filter 42 is selected to have a value of $D_{P2}$=65 mm.

In second filter 1042 used in the present embodiment, the specifications of the collection efficiency of the particles are determined with regard to a case when the gas fluid passes and a case when the liquid fluid (fluid in a liquid state) passes, respectively. Meanwhile, in first filter 1041 which is a gas filter, the specification of the collection efficiency of the particles with regard to a case when the liquid fluid passes is not determined. However, as described in the description below regarding an action, when the aggregation of the particles collected by first filter 1041 during the passage of the gas fluid is discharged to the downstream side when the liquid fluid passes, second filter 1042 needs to have a distribution of the collection efficiency which is capable of collecting the aggregation (capable of collecting particles smaller than first filter 1041).

Since the viscosity or density of the fluid is increased in an order of gas fluid<supercritical fluid<liquid fluid, the force applied to the particles is increased in this order when the fluid passes first and second filters 1041, 1042. And, as the force applied to the particles from the fluid increases, it is likely that the particles adsorbed by the filtering material may flow by the fluid to be discharged.

In $CO_2$ supplying line 1351 of the present embodiment, a heater 1353 is provided that directly changes $CO_2$ flowing within the pipe of $CO_2$ supplying line 1351 from gas state to supercritical state without passing through the liquid state. Heater 1353 is constituted by, for example, a resistant heating element, and is capable of increasing/decreasing the power supplied from a power supplying unit 1354 and controlling the temperature at which the $CO_2$ flowing the inside is heated, based on the result of the surface temperature of the pipe of $CO_2$ supplying line 1351 detected by a temperature detecting unit (not illustrated).

Liquid processing system 1001, liquid processing device 1002 and supercritical processing device 1003 including the above-described configuration are connected to a control unit 1005 as illustrated in FIGS. 8 to 10. Control unit 1005 includes a computer including a CPU and a storage unit (not illustrated). A program is recorded in the storage unit. The program is implemented with step (command) groups relating to the control associated with the operations of liquid processing system 1001, liquid processing device 1002 and supercritical processing device 1003. That is, the program is implemented with the step groups relating to the control of the operations in which wafer W is taken out from FOUP 1100, cleaned in liquid processing device 1002, subjected to drying in supercritical processing device 1003, and carried into FOUP 1100. The program is stored in a storage media such as, for example, a hard disk, a compact disk, a magnet-optical disk, and a memory card, and installed in the computer therefrom.

The operation of supercritical processing device 1003 of the present exemplary embodiment will be described with reference to FIGS. 13 to 16. In the figures below, the symbol 'S' added to each opening/closing valve represents a state where the opening/closing valve is closed and the symbol 'O' represents a state where the opening/closing valve is opened.

As described above, wafer W of which the surface is covered with IPA for an anti-dry fluid is carried out from liquid processing device 1002 by second transport mechanism 1161 after completing the cleaning processing in liquid processing device 1002. Second transport mechanism 1161 enters into supercritical processing unit 1015 where supercritical processing device 1003 capable of receiving wafer W is disposed.

In supercritical processing device 1003, as illustrated in FIG. 11, holding plate 1331 is moved to the outside of chamber body 1311 and wafer W is received from the transport arm of second transport mechanism 1161 to holding plate 1331 via support pins (not illustrated). And, wafer W is carried into chamber body 1311 through opening 1312 by moving holding plate 1331, and opening 1312 is closed by cover member 1332 to seal the inside of processing chamber 1031. Here, the liquid IPA may be supplied to the surface of wafer W before wafer W is carried into chamber body 1311.

Figure 13:
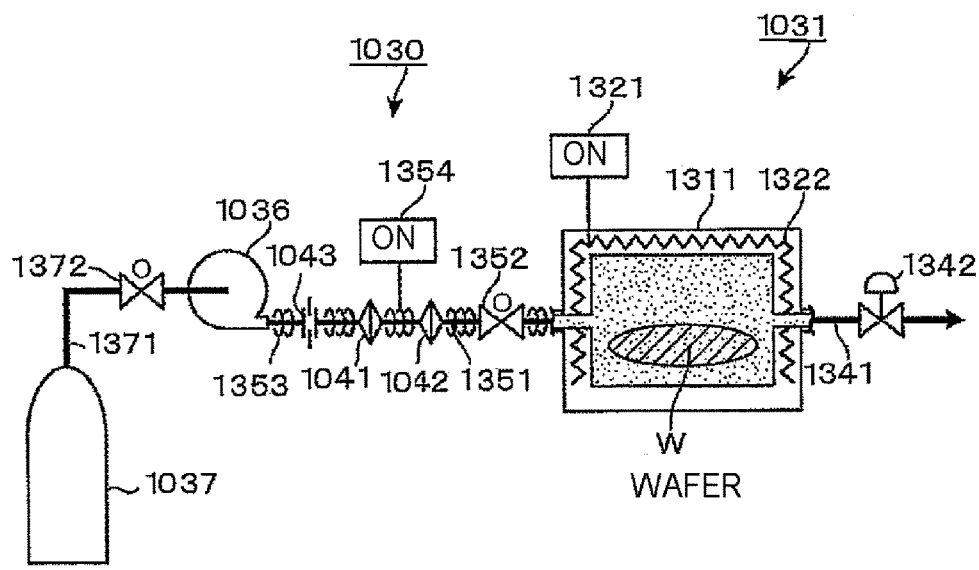
FIG. 13 is a first explanatory view illustrating the operation of the supercritical processing device.

Thereafter, as illustrated in FIG. 13, opening/closing valves 1372, 1352 of $CO_2$ supplying line 1371 and $CO_2$ supplying line 1351 are opened, booster pump 1036 is operated to supply $CO_2$ to processing chamber 1031, and the inside of processing chamber 1031 is boosted up to, for example, 8 MPa higher than the critical pressure of the $CO_2$ (absolute pressure of 7.4 MPa).

At this time, heating mechanism 1353 heats the fluid flowing the inside of the pipe of $CO_2$ supplying line 1351 by heating $CO_2$ supplying line 1351 at, for example, 50° C. which is in a range of 40° C.~100° C. Further, heater 1322 heats the internal temperature of processing chamber 1031 at, for example, 50° C. higher than the critical temperature of $CO_2$ (31° C.).

Here, when $CO_2$ is supplied to processing chamber 1031, the behavior that the particles accompanied from $CO_2$ supplying unit 1037 represents depending on the state of the fluid flowing heating mechanism 1353 will be described.

As described above, wafer W is carried into processing chamber 1031 which is opened to the atmosphere after holding plate 1331 is moved to the outside of chamber body 1311. As a result, the inside of the pipe of $CO_2$ supplying line 1351 becomes the atmospheric pressure which is the same pressure as in the processing chamber 1031 right after the supply of the $CO_2$ from booster pump 1036 is initiated.

When the $CO_2$ is supplied from booster pump 1036 to $CO_2$ supplying line 1351, during a period where the pressures of $CO_2$ supplying line 1351 and processing chamber 1031 are lower than the vapor pressure of the $CO_2$ at the internal temperature, the $CO_2$ is evaporated at the discharging side of booster pump 1036 to flow within $CO_2$ supplying line 1351 in a gas state. At this time, as explained in FIG. 12A, since first filter 1041 is capable of collecting 99.9999999% or more of the particles of 3 nm where the collection efficiency becomes the minimum among the particles included in the gas fluid, the particles are hardly introduced at the downstream side of first filter 1041.

Figure 15:
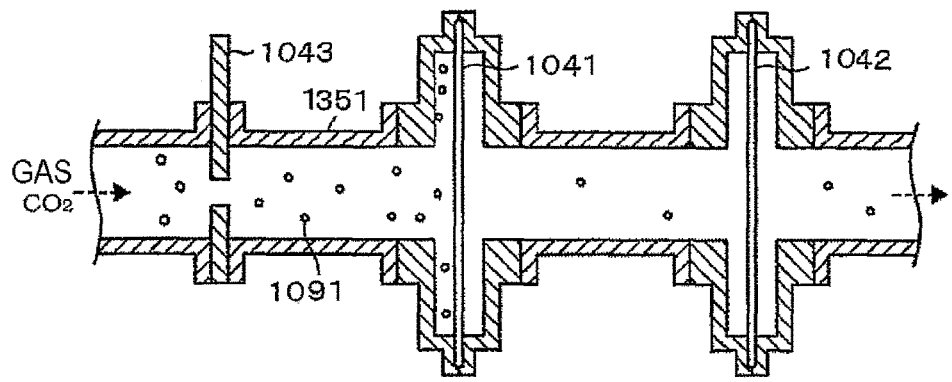
FIG. 15 is a first schematic explanatory view illustrating the state of the inside of a fluid supplying path provided in the supercritical processing device.
Figure 16:
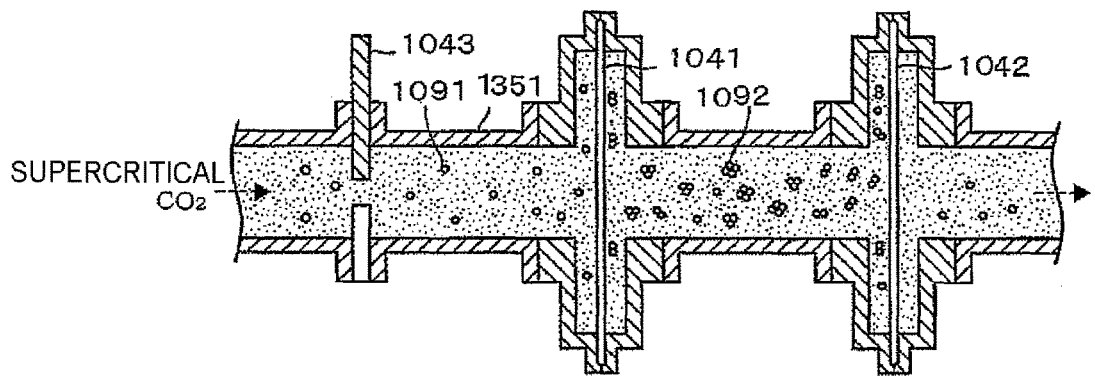
FIG. 16 is a second schematic explanatory view illustrating the state of the inside of the fluid supplying path.

Therefore, as schematically illustrated in FIG. 15, even though second filter 1042 capable of collecting the particles 1091 having the same particle size or more as compared to the particles collected by first filter 1041 when the gas fluid passes, is disposed in the downstream side of first filter 1041, particles 1091 within the gas fluid introduced to processing chamber 1031 is greatly decreased.

At that time, first filter 1041 collects particles 1091 by both of the adsorption effect and the sieve effect as described above. As the amount of particles 1091 collected by the adsorption effect is increased, the particles are aggregated each other to be grown to aggregated particles 1092 having a large particle size.

Meanwhile, as the liquid $CO_2$ is continuously supplied from booster pump 1036, the pressures within $CO_2$ supplying line 1351 and processing chamber 1031 gradually increase. When the temperature and the pressure within $CO_2$ supplying line 1351 and processing chamber 1031 become higher than the critical temperature and the critical pressure of the $CO_2$, respectively, the fluid thereof becomes supercritical fluid. Here, as described above, since $CO_2$ supplying line 1351 is heated to 50° C. which is sufficiently higher than the critical temperature of the $CO_2$ by heating mechanism 1353, the fluid that flows within $CO_2$ supplying line 1351 is directly changed from gas fluid into supercritical fluid. Meanwhile, in FIGS. 15 to 20, the description of heating mechanism 1353 will be omitted.

As described above, since the $CO_2$ in the supercritical state has the viscosity or density higher than the $CO_2$ in the gas state, the force applied to particles 1091 adsorbed to the filtering material of first filter 1041 is increased when the $CO_2$ in the supercritical state passes first filter 1041. Specifically, the more the particle size of aggregated particles 1092, the higher the force applied to aggregated particles 1092. Accordingly, when the state of the fluid that passes first filter 1041 is changed from the gas fluid into the supercritical fluid, some of aggregated particles 1092 are separated from the filtering material to flow to the downstream side of first filter 1041.

At that time, since second filter 1042 having the filtration precision when liquid passes (the minimum particle size in which the collection efficiency is 97% or more) is smaller than first filter 1041 is disposed at the downstream side of first filter 1041, aggregated particles 1092 having the particle size larger than the filtration precision may be collected by second filter 1042. As described above, since the particles are mainly collected by the sieve effect, the filtration precision when the liquid passes may be similar to the case of the liquid regardless of the difference of the viscosity or density between the supercritical fluid and liquid.

As a result, even after the $CO_2$ that flows within $CO_2$ supplying line 1351 is changed from gas state into supercritical state, aggregated particles 1092 or particles 1091 having the particle size larger than the filtration precision of second filter 1042 may be suppressed from being introduced into processing chamber 1031.

As such, when the temperature and pressure within processing chamber 1031 become higher than the critical temperature and the critical pressure of the $CO_2$, the pressure control valve 1342 is opened to discharge the supercritical $CO_2$ through discharging line 1341 while the opening degree is controlled such that the inside of processing chamber 1031 is maintained to a pressure higher than the critical pressure. As a result, the supply of the supercritical $CO_2$ from $CO_2$ supplying line 1351 and the discharging of the supercritical $CO_2$ from discharging line 1341 are performed successively to resolve the IPA on the surface of wafer W in the supercritical $CO_2$ supplied to processing chamber 1031. Then, the liquid IPA attached to wafer W is removed by substituting the IPA with the supercritical $CO_2$.

Figure 14:
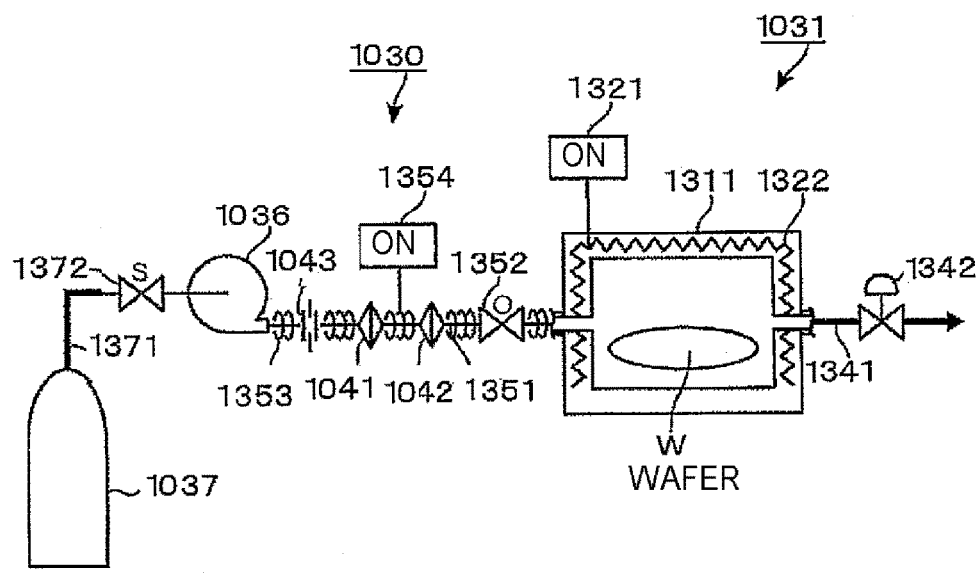
FIG. 14 is a second explanatory view illustrating the operation of the supercritical processing device.

When a sufficient time elapses during which the IPA is substituted with the supercritical $CO_2$ and the IPA is sufficiently discharged from processing chamber 1031, opening/closing valve 1372 of $CO_2$ supplying line 1371 is closed and booster pump 1036 stops to stop supplying the $CO_2$ to processing chamber 1031, as illustrated in FIG. 14. Further, pressure control valve 1342 is fully opened to discharge the $CO_2$ within processing chamber 1031.

As described above, when the processing by the supercritical $CO_2$ is completed, dried wafer W from which the liquid is removed is taken out by second transport mechanism 1161, to be received in FOUP 1100 through an opposite path to a case when wafer W is carried in, thereby completing a series of processes. In liquid processing system 1001, the above-described processing is consecutively performed for each wafer W within FOUP 1100.

Supercritical processing device 1003 according to the present exemplary embodiment provides the following effects. Since first filter 1041 is installed in fluid supplying line 1351 where the fluid supplied to processing chamber 1031 that processes wafer W using the supercritical $CO_2$ passes, the foreign matter among the fluid may be removed by first filter 1041. Further in the downstream of first filter 1041, second filter 1042 is installed to remove the aggregated particles 1092 adsorbed when the gas-state $CO_2$ passes first filter 1041. When compared to a case where the supercritical $CO_2$ passes, the particle size that can pass second filter 1042 is smaller than the particle size that can pass first filter 1041. As a result, even if aggregated particles 1092 attached to first filter 1041 when the gas passes are discharged into the supercritical $CO_2$, aggregated particles 1092 may be collected by second filter 1042 at the downstream side and the introduction of aggregated particles 1092 into processing chamber 1031 may be suppressed.

In the above-described exemplary embodiment, heating mechanism 1353 is provided to control the internal temperature of $CO_2$ supplying line 1351 such that the $CO_2$ that flows within $CO_2$ supplying line 1351 is directly changed from gas state into supercritical state. However, providing heating mechanism 1353 is not an essential requirement, and the fluid within $CO_2$ supplying line 1351 may be changed in an order of gas state->liquid state->supercritical state.

Figure 17:
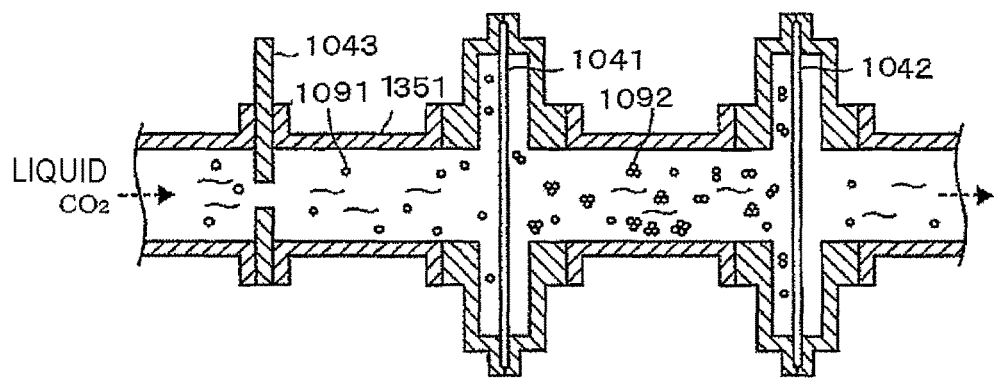
FIG. 17 is a third schematic explanatory view illustrating the state of the inside of the fluid supplying path.

As illustrated in FIG. 17, when the fluid that flows within the pipe of $CO_2$ supplying line 1351 is a liquid fluid, a higher force is applied to aggregated particles 1092 or particles 1091 which are attached to first filter 1041 as compared to the case where the supercritical fluid is applied. As a result, relatively smaller aggregated particles 1092 are separated as compared to the case where the supercritical fluid passes. However, the fact that second filter 1042 having less filtration precision than first filter 1041 is disposed at the downstream side of first filter 1041 so that aggregated particles 1092 having larger diameters than the filtration precision may be collected at second filter 1042 is similar to the case where the supercritical fluid passes.

Further, the fluid supplied to processing chamber 1031 is not limited to a case of liquid $CO_2$. For example, the fluid (liquid raw material) such as, for example, IPA or fluorine containing organic solvent such as hydrofluoroether, which is in a liquid state at the room temperature, may be changed into a supercritical state at supercritical fluid supplying unit 1038, and then, supplied to processing chamber 1031 (see, e.g., FIG. 18). Supercritical fluid supplying unit 1038 is configured such that a spiral pipe 1381 that prepares supercritical fluid is disposed around a halogen lamp 1383 which is a heating mechanism.

Then, after the liquid raw material is supplied from a raw material supplying unit 1037 to the space at the bottom side of spiral pipe 1381, opening/closing valves 1372, 1352 at the upstream and downstream of spiral pipe 1381 are closed, the liquid raw material within spiral pipe 1381 is heated by supplying power from power supplying unit 1382 to halogen lamp 1383 to evaporate the raw material. Accordingly, the temperature and pressure of the raw material are increased and the raw material is made to be a supercritical state. Then, even when the supercritical fluid is in the temperature and pressure which are capable of maintaining the supercritical state after the supercritical fluid is supplied to processing chamber 1031, opening/closing valve 1352 at the downstream side of supercritical fluid supplying unit 1038 is opened to supply the supercritical fluid to processing chamber 1031. When substitutionality of the supercritical fluid with the anti-dry liquid is good, the liquid may be removed from the surface of wafer W by the supercritical fluid supplied in a batch mode from supercritical fluid supplying unit 1038.

As in supercritical processing device 1003 of the present exemplary embodiment, even though the supercritical fluid prepared at supercritical fluid supplying unit 1038 is supplied to processing chamber 1031, the gas fluid flows through first filter 1041 or second filter 1042 during a period until the atmospheric pressures of fluid supplying line 1351 (fluid supplying path) or the inside of processing chamber 1031 become the critical pressure or more. Therefore, even though the fluid which is prepared into a supercritical state in advance is supplied from supercritical fluid supplying unit 1038, the fluid flows through fluid supplying line 1351 while the fluid is being changed from the gas fluid into the supercritical fluid (or may be via the liquid fluid depending on the temperature condition). Therefore, aggregated particles 1092 may be collected by second filter 1042 by disposing second filter 1042 having the filtration precision at the liquid passing is smaller than first filter 1041 at the downstream side of first filter 1041.

As described above, the scheme where aggregated particles 1092 aggregated by being adsorbed to first filter 1041 at the gas fluid passing are prevented from being introduced to processing chamber 1031 is not limited to a case where first and second filters 1041, 1042 are disposed on a common $CO_2$ supplying line (fluid supplying line) 1351. As illustrated in, for example, FIGS. 19 and 20, first filter 1041 and second filter 1042 may be disposed in each of a first $CO_2$ supplying line 1351a (first fluid supplying path) and a second $CO_2$ supplying line 1351b (second fluid supplying path) which are configured to be switchable by a switch valve 1355 (flow path switching unit) and are disposed in parallel between booster pump 1036 and opening/closing valve 1352.

In this case, first filter 1041 having the collection efficiency of the particles of a predetermined particle size (e.g., 3 nm or more) to be the same or more than a predetermined value is used. Further, second filter 1042 having the filtration precision of liquid passing (e.g., the collection efficiency of the particles having the size of 65 nm) to be the same or more than a predetermined value is used.

And, control unit 1005, for example, monitors the pressures within both $CO_2$ supplying line 1351a, 1351b. Control unit 1005 operates switch valve 1355 such that the flow path in which $CO_2$ flows becomes first $CO_2$ supplying line 1351a during a period where the fluid flowing from booster pump 1036 to processing chamber 1031 is the gas state (see, FIG. 19) and the flow path in which $CO_2$ flows is switched into second $CO_2$ supplying line 1351b at the timing when the fluid flowing to processing chamber 1031 becomes the supercritical state (see, FIG. 20).

Figure 18:
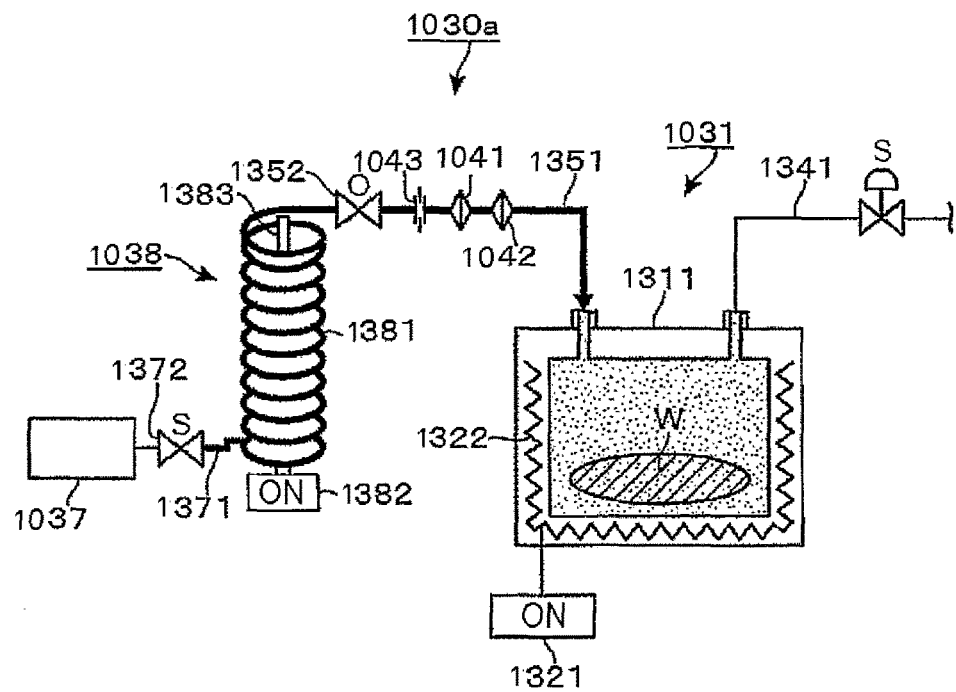
FIG. 18 is a configuration view of a supercritical processing device according to a third exemplary embodiment of the present disclosure.
Figure 19:
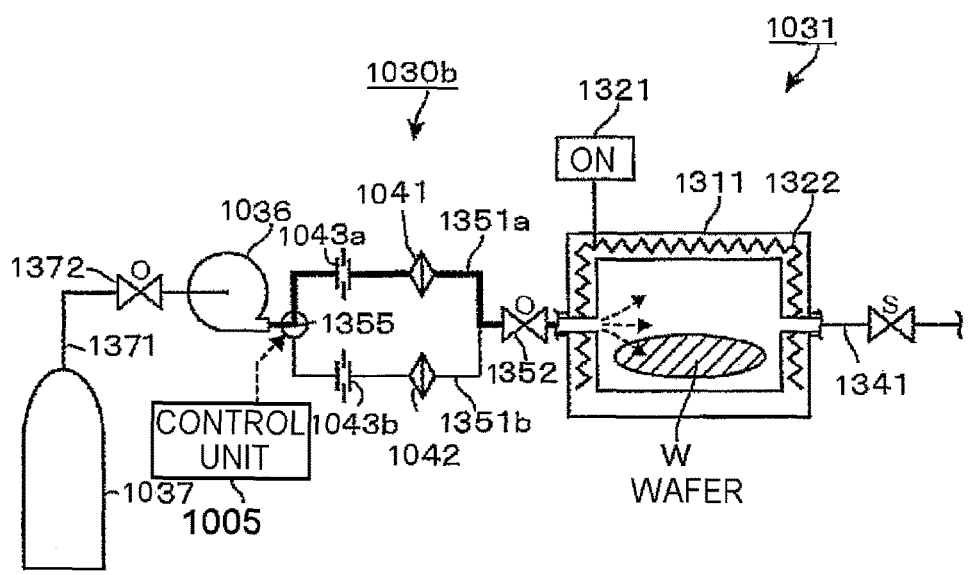
FIG. 19 is a first explanatory view illustrating the operation of the supercritical processing apparatus according to the third exemplary embodiment.
Figure 20:
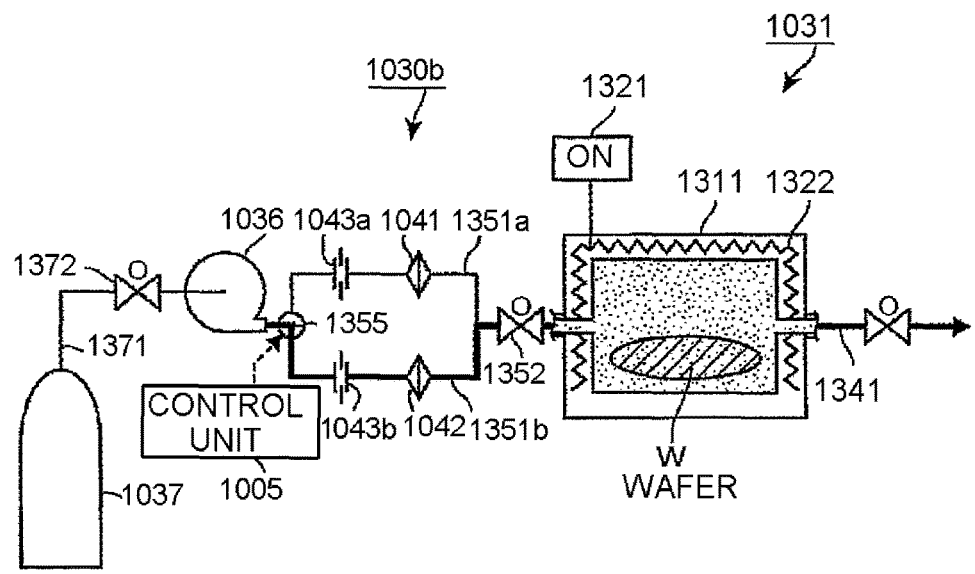
FIG. 20 is a second explanatory view illustrating the operation of the supercritical processing apparatus according to the third exemplary embodiment.

Even in the above-described example, from the point of view where the introduction of aggregated particles 1092 aggregated by being adsorbed to first filter 1041 into processing chamber 1031 is suppressed, the common actions and effects to supercritical processing device 1003 as illustrated in FIGS. 10 and 18 occur.

In each example as described above, the anti-dry liquid attached to wafer W is not limited to a case where the liquid is removed by being contacted with the fluid in the supercritical state. For example, the liquid may well be removed by the fluid in the subcritical state.

EXAMPLES

Experiment

The states of the fluid that flows within $CO_2$ supplying line 1351 are compared in the cases where the inside of $CO_2$ supplying line 1351 is heated or not with opening/closing valve 1352 is installed in $CO_2$ supplying line 1351.

A. Experimental Conditions

Example

The $CO_2$ was supplied to processing chamber 1031 with the conditions where only first filter 1041 was installed in $CO_2$ supplying line 1351 of supercritical processing device 1003 as illustrated in FIG. 10, and the pipe of $CO_2$ supplying line 1351 from the discharging side of booster pump 1036 to the entrance of processing chamber 1031 was maintained at 110° C. The pressure within processing chamber 1031 was increased using the internal pressure of the cylinder of $CO_2$ supplying unit 1037 first, and booster pump 1036 was operated at the timing when the inside of processing chamber 1031 reaches 6 MPa. Then, the changes of the temperature of the fluid flowing within pipes were measured at each position of (1) between the discharging side of booster pump 1036 and an orifice 1043, (2) between orifice 1043 and first filter 1041, and (3) between first filter 1041 and processing chamber 1031, and the change of the pressure within processing chamber 1031 was measured.

Comparative Example

The change of the temperature of the fluid and the change of the pressure within processing chamber 1031 were measured at the same conditions as in the example except that the heating by opening/closing valve 1352 is not performed.

B. Experimental Results

Figure 21:
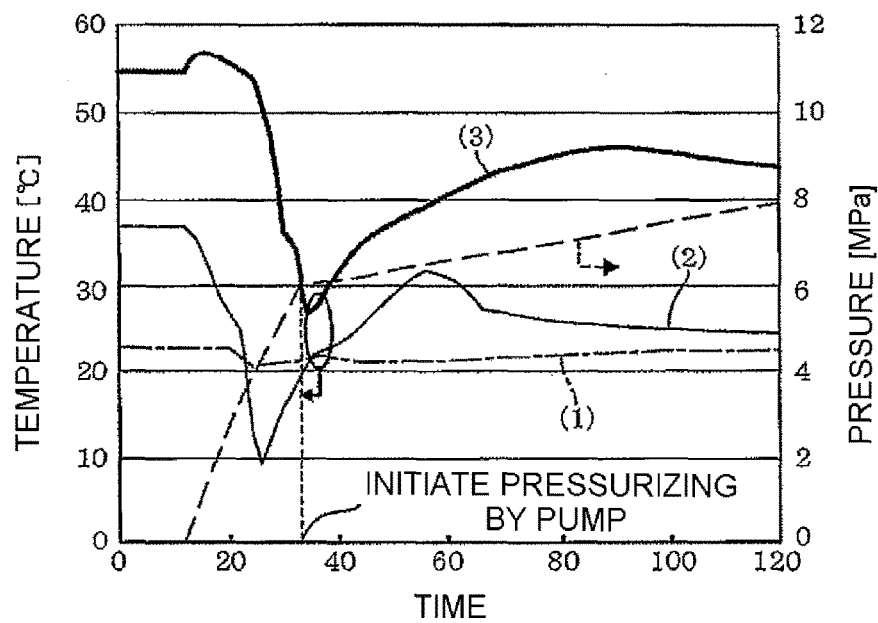
FIG. 21 is an explanatory view illustrating the state changes of the pressure and the temperature of the fluid that flows within the heated fluid supplying path.
Figure 22:
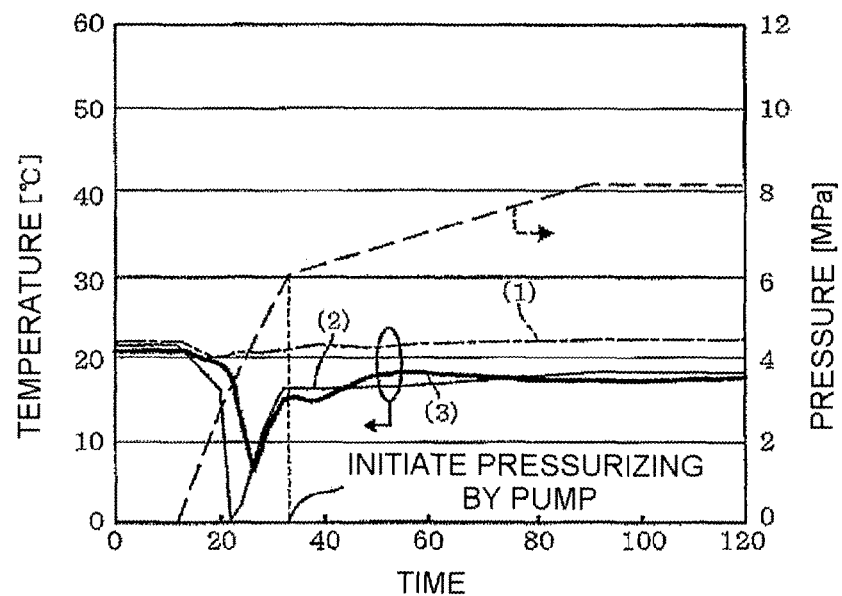
FIG. 22 is an explanatory view illustrating the state changes of the pressure and the temperature of the fluid that flows within the fluid supplying path, which is not heated.
Figure 23:
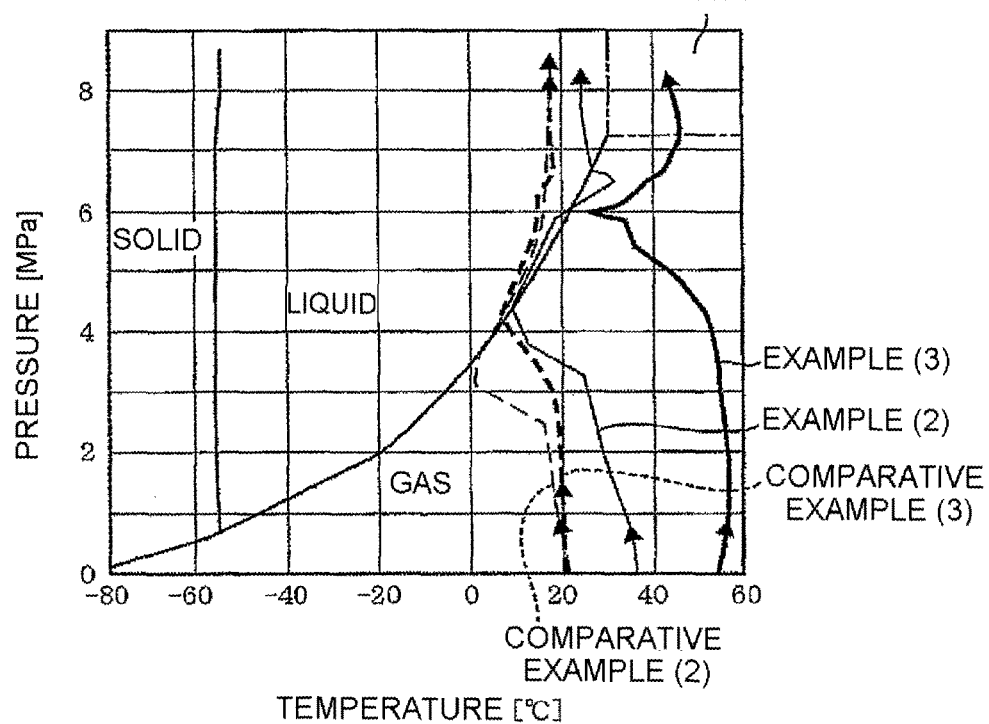
FIG. 23 is an explanatory view illustrating the state change of the fluid that flows within the fluid supplying path depending on whether or not the fluid supplying path is heated.

The results of the example and the comparative example were represented in graphs of FIGS. 21 and 22, respectively. In each graph, the transverse axis indicates time after the supply of $CO_2$ is initiated, the left vertical axis indicates the temperature, and the right vertical axis indicates the pressure. Further, the temperature change of the fluid at position (1) is indicated as a dot-chain line, the temperature change at position (2) is indicated as a thin solid line, and the temperature change at position (3) is indicated as a thick solid line. Further, FIG. 23 illustrates that how the state of the fluids at positions (2), (3) is changed into one of the gas state, the liquid state, and the supercritical state according to the above-described temperature change and the pressure change. The horizontal axis indicates the temperature of the fluid and the vertical axis indicates the pressure. The state change of position (2) of the example is indicated as a thin solid line, and the state change of position (3) is indicated as a thick solid line. Further, the state change of position (2) of the comparative example is indicated as a thin broken line, and the state change of position (3) of the comparative example is indicated as a thick broken line. Meanwhile, since the pressure loss of first filter 1041 is about 100 kPa, the pressure within $CO_2$ supplying line 1351 at the downstream of orifice 1043 may be considered to be the same as in the pressure of processing chamber 1031.

According to the result represented in FIG. 21, in the downstream side of orifice 1043 where the fluid is expanded after being compressed, that is, in position (2) and position (3), the temperature of the fluid is rapidly decreased during the period where the pressure difference between the upstream and the downstream of orifice 1043 is large. Then, the pressure difference between before and after orifice 1043 is decreased in accordance with the pressure increase within processing chamber 1031, and as a result, the decrease of temperature of the fluid is also decreased. Further, the temperature of the fluid at position (3) is maintained to a temperature higher than 25° C., by heating $CO_2$ supplying line 1351.

According to the result as illustrated in FIG. 22, the comparative example shows similar result to the example in that the temperature is rapidly decreased in the downstream side of orifice 1043 (positions (2) and (3)), and then, as the pressure difference before and after orifice 1043 is decreased, the decrease of the temperature of the fluid is decreased. Meanwhile, in the comparative example where $CO_2$ supplying line 1351 is not heated, the temperatures at positions (2) and (3) are lower than 20° C.

According to FIG. 23 which represents the state change of the fluid at each position based on the measured result of the temperature and pressure, the fluid that flows in position (2) of the example and in positions (2), (3) of the comparative example where the line is not heated is introduced into processing chamber 1031 in the liquid state. Meanwhile, the fluid that flows in position (3) of the example where $CO_2$ supplying line 1351 is heated becomes the supercritical state from the gas state without going through the liquid state. Accordingly, when an appropriate temperature control is performed by further increasing the temperature at which $CO_2$ supplying line 1351 is heated, the $CO_2$ may be changed from the gas state into the supercritical state without going through the liquid state in position (2) at the upstream side of first filter 1041 and in position (3) at the downstream side of first filter 1041.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate processing apparatus comprising:
    a processing chamber configured to process a substrate by a supercritical fluid or a subcritical fluid;
    a fluid supplying unit configured to supply a fluid to the processing chamber;
    a fluid supplying path provided with a booster pump and a heating mechanism and configured to connect the fluid supplying unit with the processing chamber and allow the fluid to pass therein, a gas fluid supplied from the fluid supplying unit to pass the fluid supplying path being changed into one of a liquid fluid, the supercritical fluid and the subcritical fluid by the booster pump and the heating mechanism while passing through the fluid supplying path;
    a first filter provided at a downstream side of the booster pump and the heating mechanism in the fluid supplying path and configured as a gas filter to collect particles within the gas fluid; and
    a second filter provided at a downstream side of the first filter in the fluid supplying path and configured as a liquid filter to collect, in one of the liquid fluid, the supercritical fluid and the subcritical fluid, aggregated particles adsorbed to the first filter when the gas fluid passes through the first filter,
    wherein a size of particles capable of passing through the second filter is smaller than a size of particles capable of passing through the first filter when compared by passing one of the liquid fluid, the supercritical fluid and the subcritical fluid through the first filter and the second filter.

2. The substrate processing apparatus of claim 1, wherein when compared by passing the gas fluid through the first filter and the second filter, a size of particles adsorbed and collected by the first filter is equal to or less than a size of particles adsorbed and collected by the second filter.

3. The substrate processing apparatus of claim 1, wherein the heating mechanism is configured to heat the inside of the fluid supplying path such that the fluid supplied to the processing chamber is directly changed from the gas fluid into the supercritical fluid or the subcritical fluid as the pressure within the fluid supplying path is increased.

4. The substrate processing apparatus of claim 1, wherein the fluid passing the fluid supplying path is changed into the supercritical fluid or the subcritical fluid after going through the liquid fluid.

5. The substrate processing apparatus of claim 1, wherein the fluid passing the fluid supplying path is made by evaporating the fluid supplied in one of the liquid fluid, the supercritical fluid and the subcritical fluid from the fluid supplying unit.

* * * * *